United States Patent
Hikita et al.

(10) Patent No.: US 10,527,882 B2
(45) Date of Patent: Jan. 7, 2020

(54) OPTICAL LAMINATED BODY AND ORGANIC ELECTROLUMINESCENCE DISPLAY DEVICE USING SAME

(71) Applicant: NITTO DENKO CORPORATION, Ibaraki-shi, Osaka (JP)

(72) Inventors: Takami Hikita, Ibaraki (JP); Kentarou Takeda, Ibaraki (JP); Tomonori Ueno, Ibaraki (JP); Atsushi Kishi, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/774,702

(22) PCT Filed: Nov. 16, 2016

(86) PCT No.: PCT/JP2016/083937
§ 371 (c)(1),
(2) Date: May 9, 2018

(87) PCT Pub. No.: WO2017/086338
PCT Pub. Date: May 26, 2017

(65) Prior Publication Data
US 2018/0329125 A1      Nov. 15, 2018

(30) Foreign Application Priority Data

Nov. 20, 2015   (JP) ................................. 2015-227681
Nov. 15, 2016   (JP) ................................. 2016-222251

(51) Int. Cl.
*G02F 1/1335*      (2006.01)
*G09F 9/30*        (2006.01)
(Continued)

(52) U.S. Cl.
CPC .......... *G02F 1/133528* (2013.01); *G09F 9/30* (2013.01); *H01L 51/5237* (2013.01);
(Continued)

(58) Field of Classification Search
CPC ................................................ G02F 1/133528
See application file for complete search history.

(56) References Cited

U.S. PATENT DOCUMENTS

| | | | |
|---|---|---|---|
| 6,762,266 B2 | 7/2004 | Minakuchi et al. | |
| 7,722,935 B2 | 5/2010 | Umemoto et al. | |

(Continued)

FOREIGN PATENT DOCUMENTS

| | | |
|---|---|---|
| JP | 2001-4837 A | 1/2001 |
| JP | 2003-207640 A | 7/2003 |

(Continued)

OTHER PUBLICATIONS

International Search Report dated Feb. 21, 2017, issued in counterpart International Application No. PCT/JP2016/083937 (2 pages).
(Continued)

*Primary Examiner* — Edmond C Lau
(74) *Attorney, Agent, or Firm* — Westerman, Hattori, Daniels & Adrian, LLP

(57) ABSTRACT

There is provided an optical laminate capable of toeing suitably applied even to an organic EL display apparatus that is extremely thin and is bendable or foldable. An optical laminate according to an embodiment of the present invention is used for an organic electroluminescence display apparatus. The optical laminate includes in this order: a surface protective layer; a polarizer; and an optical compensation layer. The surface protective layer is flexible, has a function of substituting for a cover glass for an organic electroluminescence display apparatus, and functions as a protective layer for the polarizer.

8 Claims, 3 Drawing Sheets

(51) Int. Cl.
*H05B 33/04* (2006.01)
*H01L 51/52* (2006.01)
*G02B 5/30* (2006.01)

(52) U.S. Cl.
CPC .......... *H05B 33/04* (2013.01); *B32B 2307/42* (2013.01); *G02B 5/3033* (2013.01); *H01L 51/5262* (2013.01)

(56) References Cited

U.S. PATENT DOCUMENTS

| | | |
|---|---|---|
| 8,344,396 B2 | 1/2013 | Shim et al. |
| 9,857,633 B2 | 1/2018 | Toyoshima et al. |
| 10,199,600 B2 | 2/2019 | Lee et al. |
| 2002/0169267 A1 | 11/2002 | Minakuchi et al. |
| 2006/0103796 A1 | 5/2006 | Kawamoto et al. |
| 2007/0243340 A1 | 10/2007 | Umemoto et al. |
| 2012/0037928 A1 | 2/2012 | Shim et al. |
| 2015/0049281 A1 | 2/2015 | Lee et al. |
| 2015/0185559 A1* | 7/2015 | Yu ........................... G02B 1/10 349/96 |
| 2015/0369981 A1 | 12/2015 | Takeda et al. |
| 2016/0025900 A1 | 1/2016 | Suzuki |
| 2016/0085100 A1 | 3/2016 | Toyoshima et al. |
| 2016/0245972 A1 | 8/2016 | Yamanaka et al. |
| 2017/0052300 A1 | 2/2017 | Takeda et al. |
| 2018/0006275 A1* | 1/2018 | Maruyama ................ G09F 9/30 |
| 2018/0210288 A1* | 7/2018 | Lee .......................... G02B 5/28 |

FOREIGN PATENT DOCUMENTS

| | | |
|---|---|---|
| JP | 2003-215341 A | 7/2003 |
| JP | 2004-91618 A | 3/2004 |
| JP | 2004-226842 A | 8/2004 |
| JP | 2006-163343 A | 6/2006 |
| JP | 3815790 B1 | 8/2006 |
| JP | 2008-15408 A | 1/2008 |
| JP | 2010-139548 A | 6/2010 |
| JP | 2014-170221 A | 9/2014 |
| KR | 10-2012-0015942 A | 2/2012 |
| KR | 10-2015-0020438 A | 2/2015 |
| WO | 2014/141734 A1 | 9/2014 |
| WO | 2014/185001 A1 | 11/2014 |
| WO | 2015/064581 A1 | 5/2015 |
| WO | 2015/166930 A1 | 11/2015 |
| WO | 2016/158300 A1 | 10/2016 |

OTHER PUBLICATIONS

Written Opinion dated Feb. 13, 2019, issued in counterpart SG Application No. 11201803498Q. (6 pages).

Third Party Observation dated Oct. 25, 2019, issued in counterpart JP Application No. 2016-222251, with English translation (28 pages).

* cited by examiner

OPTICAL LAMINATED BODY AND ORGANIC ELECTROLUMINESCENCE DISPLAY DEVICE USING SAME

TECHNICAL FIELD

The present invention relates to an optical laminate and an organic electroluminescence display apparatus using the optical laminate.

BACKGROUND ART

The number of opportunity for the use of a display apparatus, for example, a smart device typified by a smart, phone, digital signage, or a window display under strong ambient light has been increasing in recent years. Along with the increase, there has been occurring a problem such as: the reflection of the ambient-light by the display apparatus itself or a reflector to be used in the display apparatus, such as a touch panel portion, a glass substrate, or a metal wiring; or the reflection of a background on the display apparatus or the reflector. In particular, an organic electroluminescence (EL) display apparatus that has started to be put into practical use in recent years is liable to cause a problem, such as the reflection of the ambient light or the reflection of the background because the apparatus has a metal layer having high reflectivity. In view of the foregoing, it has been known that such problem is prevented by arranging, as an antireflection film, a circularly polarizing plate including a retardation film (typically a λ/4 plate) on a viewer, side.

Incidentally, there, is a continuing demand for thinning of the organic EL display apparatus. Further, in recent years, there has been an increasing demand for an organic EL display apparatus that is flexible and bendable.

CITATION LIST

Patent Literature

[PTL 1] JP 2010-139548 A
[PTL 2] JP 2003-207640 A
[PTL 3] JP 2004-226842 A
[PTL 4] JP 3815790 B2

SUMMARY OF INVENTION

Technical Problem

The present invention has been made in order to solve the conventional problems as described above, and an object of the present invention is to provide an optical laminate capable of being suitably applied even to an organic EL display apparatus that is extremely thin and is bendable or foldable.

Solution to Problem

An optical laminate according to an embodiment of the present invention is used for an organic electroluminescence display apparatus. The optical laminate includes in this order: a surface protective layer; a polarizer; and an optical compensation layer. The surface protective, layer is flexible, has a function of substituting for a cover glass for an organic electroluminescence display apparatus, and functions as a protective layer for the polarizer.

In one embodiment of the present invention, the surface protective layer is formed of a single resin film.

In one embodiment of the present invention, the surface protective layer includes a hard coat layer and a resin film in the stated order from a surface side.

In one embodiment of the present invention, the surface protective layer has such bendability as to allow the optical laminate to be bent 200,000 times with a radius of curvature of 3 mm or less, and a viewer side surface of the surface protective layer has a pencil hardness of 2H or more and such scratch resistance that the viewer side surface is free of occurrence of a flaw when rubbed 300 times back and forth with a load of 1,000 g.

In one embodiment of the present invention, the optical compensation layer is formed of a retardation film. An in-plane retardation Re (550) of the retardation film is from 100 nm to 130 nm and satisfies a relationship of Re (450)<Re (550)<Re (650), and an angle formed between a slow axis of the retardation film, and an absorption axis of the polarizer is from 35° to 55°.

In one embodiment of the present invention, the optical compensation layer includes a first liquid crystal alignment fixed layer and a second liquid crystal alignment fixed layer in the stated order from a polarizer side. The first liquid crystal alignment fixed layer has an in-plane retardation Re (550) of from 180 nm to 320 nm, and the second liquid, crystal alignment fixed layer has an in-plane retardation Re (550) of from 100 nm to 180 nm, and an angle formed between a slow axis of the first liquid crystal alignment fixed layer and an absorption axis of the polarizer is from 10° to 20°, and an angle formed between a slow axis of the second liquid crystal alignment fixed layer and the absorption axis of the polarizer is from 65° to 85°.

In one embodiment of the present invention, the optical laminate further includes a conductive layer on an opposite side of the optical compensation layer to the polarizer.

According to another aspect of the present invention, there is provided an organic electroluminescence display apparatus. The organic electroluminescence display apparatus includes the above-described optical laminate on a viewer side, wherein the surface protective layer of the laminate is arranged on the viewer side.

In one embodiment of the present invention, at least part of the organic electro luminescence display apparatus is bendable with a radius of curvature of 10 mm or less.

Advantageous Effects of Invention

According to the embodiment of the present invention, in the optical laminate for an organic EL display apparatus, the surface protective layer that has a function of substituting for a cover glass and functions as a protective layer for the polarizer is used. Thus, the optical laminate capable of being suitably applied even to an organic EL display apparatus that is extremely thin and is bendable or foldable can be obtained.

DESCRIPTION OF EMBODIMENTS

Now, typical embodiments of the present invention are described. However, the present invention is not limited to these embodiments.

Definitions of Terms and Symbols

The definitions of terms and symbols used herein are as follows.
(1) Refractive Indices (nx, ny, and nz)

A symbol "nx" represents a refractive index in a direction in which an in-plane refractive index: is maximum (that is, slow axis direction), "ny" represents a refractive index in a direction perpendicular to the slow axis in the plane (that is, fast axis direction), and "ns" represents a refractive index in a thickness direction.
(2) In-Plane Retardation (Re)

The term "Re ($\lambda$)" refers to the in-plane: retardation of a film measured at 23° C. with light having a wavelength of $\lambda$ nm. For example, the term "Re (150)" refers to the in-plane, retardation of the film measured at 23° C. with light having a wavelength of 550 nm. The Re ($\lambda$) is determined from the equation "Re=(nx−nv) xd" when the thickness of the film is represented by d (nm).
(3) Thickness Direction Retardation (Rth)

The term "Rth ($\lambda$)" refers to the thickness direction retardation of the film measured at 23° C. with light having a wavelength of $\lambda$ nm. For example, the term "Rth (550)" refers to the thickness direction retardation of the film measured at 23° C. with light having a wavelength of 550 nm. The Rth ($\lambda$) is determined from the equation "Rth=(nx−nz)sd" when the thickness of the film is represented by d (nm).
(4) Nz Coefficient An Nz coefficient is determined from the equation "Nz=Rth/Re".
(5) Alignment Fixed Layer of Liquid Crystal Compound The term "alignment fixed layer" as used herein refers to a layer in which a liquid crystal compound is aligned in a predetermined direction and its alignment state is fixed. The "alignment fixed layer" is a concept encompassing an aligned cured layer obtained by curing a liquid crystal monomer.
(6) Angle When reference is made to an angle in this description, the angle comprehends angles in both a clockwise direction and a counterclockwise direction unless otherwise stated.

A. Overall Configuration of Optical Laminate

An optical laminate according to an embodiment of the present invention is used for an image display apparatus (e.g., a liquid crystal display apparatus or an organic EL display apparatus), preferably a bendable image display apparatus, more preferably a bendable organic EL display apparatus, still more preferably a foldable organic EL display apparatus. For simplicity, a case in which the optical laminate is applied to a bendable or foldable organic EL display apparatus is described below. However, it is obvious to a person skilled in the art that the optical laminate is similarly applicable to a liquid crystal display apparatus.

Figure 1:
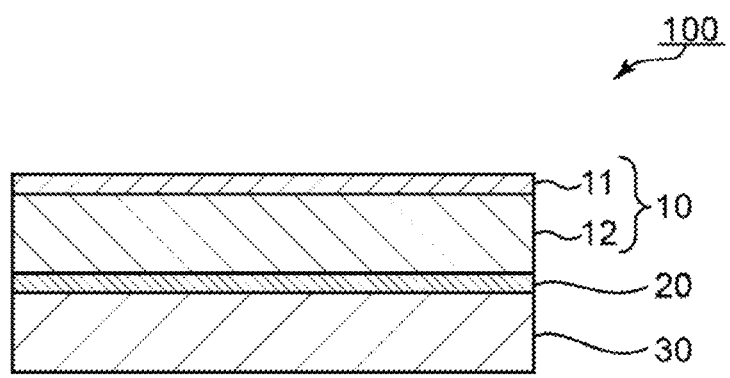
FIG. 1 is a schematic sectional view of an optical laminate according to one embodiment of the present invention.

FIG. 1 is a schematic sectional view of an optical laminate according to one embodiment of the present invention. An optical laminate 100 according to this embodiment includes, in this order, a surface protective layer 10, a polarizer 20, and an optical compensation layer 30. The surface protective layer 10 is flexible. Further, the surface protective layer 10 has a function of substituting for a cover glass for an organic EL display apparatus and functions as a protective layer for the polarizer 20. Besides, as described in detail later, the surface protective layer is markedly thin as compared to a conventional cover glass. Accordingly, in the embodiment of the present invention, contributions can be made to remarkable thinning of an organic EL display apparatus because the surface protective layer itself is thin and an outer protective film for the polarizer can be eliminated. The thinning of the organic EL display apparatus broadens the range of design choices, and hence has a high commercial value. Further, by virtue of a synergetic effect of the thinning of the organic EL display apparatus and the surface protective layer having flexibility, an organic EL display apparatus that is preferably bendable (more preferably foldable) can be realized. In the illustrated example, the surface protective layer 10 includes a hard coat layer 11 and a resin film 12 in the stated order from a surface side. The hard coat layer may be eliminated, or the hard coat layer may be formed on each of both sides of the resin film, depending on the configuration of the resin film. The surface protective layer 10 preferably has such bendability as to allow the optical laminate to be bent 200,000 times with a radius of curvature of 3 mm. When the surface protective layer has such bendability, in the case of applying the optical laminate to an organic EL display apparatus, a bendable or foldable organic EL display apparatus can be realized. Further, the viewer side surface (hard coat layer surface or resin film surface) of the surface protective layer 10 preferably has a pencil, hardness of 2H or more and such scratch resistance that the viewer side: surface is free of occurrence of a flaw, when rubbed 300 times back and forth with a load of 1,000 g. When the surface protective layer has such surface characteristics, the surface protective layer can satisfactorily function as a substitute for a cover glass for an organic EL display apparatus.

In this embodiment, the optical compensation layer 30 is formed of a retardation film. In this case, the retardation film can function also as a protective layer (inner protective layer) for the polarizer. As a result, a contribution can be made to further thinning of the optical laminate (consequently of an organic EL display apparatus). As required, an inner protective layer (inner protective film) may be arranged between the polarizer and the retardation film. It is preferred that the in-plane retardation Re (550) of the retardation film be from 100 nm to 180 nm and satisfy a relationship of Re (450)<Re (550)<Re (650). An angle formed between the slow axis of the retardation film and the absorption axis of the polarizer is preferably from 35° to 55°.

Figure 2:
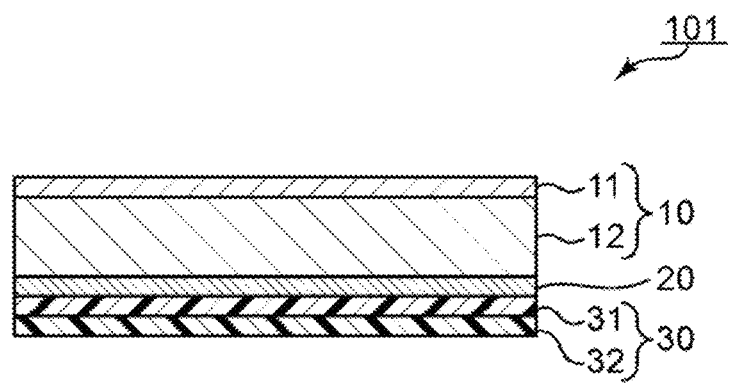
FIG. 2 is a schematic sectional view of an optical laminate according to another embodiment of the present invention.

FIG. 2 is a schematic sectional view of an optical laminate according to another embodiment of the present invention. In an optical laminate 101 according to this embodiment, the optical, compensation layer 30 has a laminated structure of alignment fixed layers of liquid crystal compounds (hereinafter referred to simply as liquid crystal alignment fixed layers). When the liquid crystal compounds are used, a difference between nx and ny of the optical compensation layer to be obtained can be markedly increased as compared to non-liquid crystal materials, and hence the thickness of the optical compensation layer for obtaining a desired in-plane retardation can be markedly reduced. As a result, further thinning of the optical laminate (consequently of an organic EL display apparatus) can be realized. Specifically, the optical compensation layer 30 includes a first liquid crystal alignment fixed layer 31 and a second liquid crystal alignment fixed layer 32 in the stated order from the polarizer 20 side. The in-plane retardation Re (550) of the first liquid crystal alignment fixed layer 31 is preferably from 180 nm to 320 nm, and the in-plane retardation Re (550) of the second liquid crystal alignment fixed layer 32 is preferably from 100 nm to 180 nm. In one embodiment, an angle formed between the slow axis of the first liquid crystal alignment fixed layer and the absorption axis of the polarizer is preferably from 10° to 20°, and an angle formed between the slow axis of the second liquid crystal alignment fixed layer and the absorption axis of the polarizer is preferably from 65° to 85°. In another embodiment, the angle formed between the slow axis of the first liquid crystal alignment fixed layer and the absorption axis of the polarizer is preferably from 65° to 85°, and the angle formed between the slow axis of the second liquid crystal alignment, fixed layer and the absorption axis of the polarizer is preferably from 10° to 20°. Also in the embodiment, of FIG. 2, as required, an inner protective layer (inner protective film) may be arranged between the polarizer and the first liquid crystal alignment fixed layer.

In each of the embodiments of FIG. 1 and FIG. 2, a conductive layer (not shown) may be arranged on the opposite side of the optical compensation layer 30 to the polarizer 20. When such conductive layer is arranged, the optical laminate can be applied to a so-called inner touch panel-type input display apparatus, which includes a built-in touch sensor between a display cell (organic EL cell) and a polarizer.

In each of the embodiments of FIG. 1 and FIG. 2, a printed layer (not shown) may be formed at a peripheral portion of the optical, laminate (more specifically a position corresponding to the bezel, of an organic EL display apparatus). The printed layer may be formed on the polarizer 20 side of the surface protective layer 10 (substantially the polarizer 20 side of the resin film 12), or may be formed on the opposite side of the optical compensation layer 30 to the polarizer 20. When the printed layer is formed on the opposite side of the optical compensation layer 30 to the polarizer 20 and both the conductive layer and the printed layer are formed, the printed layer may be typically formed between the optical compensation layer and the conductive layer.

In one embodiment, the optical laminate of the present invention has an elongate shape. The optical laminate having an elongate shape may be, for example, rolled into a roll shape to be stored and/or transported.

The total thickness of the optical, laminate of the present invention is typically from 30 µm to 300 µm, preferably from 40 µm to 250 µm. The total thickness is markedly small as compared to the total thickness (typically 800 µm) of a cover glass and a circularly polarizing plate in a conventional configuration using the cover glass and the circularly polarizing plate. Accordingly, the optical laminate of the present invention can contribute to remarkable thinning of an organic EL display apparatus, and further, can realize a bendable or foldable organic EL display apparatus.

The above-mentioned embodiments may be combined as appropriate, modifications obvious in the art may be made to the constituent elements in the embodiments, and the configurations in the embodiments may each be replaced with an optically equivalent configuration.

Now, the constituent elements of the optical laminate are described.

B. Surface Protective Layer

B-1. Characteristics of Surface Protective Layer

As described above, the surface protective layer 10 has a function of substituting for a cover glass for an organic EL display apparatus and functions as a protective layer for the polarizer 20. The "surface protective layer" in the below-described description of the characteristics of the surface protective layer means: the resin film in the case of the resin film alone; and a laminate of the hard coat layer and the resin film in the case of including the hard coat layer and the resin film. The surface protective layer has such bendability as to a flow the optical laminate to be bent preferably 200,000 times, more preferably 300,000 times, still more preferably 500,000 times with a radius of curvature of 3 mm or less (e.g., 3 µmm, 2 mm, or 1 mm). When the surface protective layer has such bendability, in the case of applying the optical laminate to an organic EL display apparatus, a bendable or foldable organic EL display apparatus can be realized. When the surface protective layer has the hard coat layer on one side of the resin film, a test for the bendability is performed under a state in which the surface protective layer is bent with the hard coat layer being on the inside. The bendability may be measured with a folding endurance tester in which a chuck on one side repeats 180° bending across a mandrel.

The surface protective layer preferably has restorability after bending. The restorability after bending refers to returning to the original state without a bending mark being left after bending. The restorability after bending may be evaluated, for example, on the basis of the number of times of repetition at which a bending mark is made after the surface protective layer (resin film or laminate) has been repeatedly subjected to 180° bending with a radius of curvature of 1 mm. The surface protective layer preferably has a restorability of 10,000 times or more under such conditions.

The viewer side surface (hard coat, layer surface or resin film surface) of the surface protective layer has a pencil hardness of preferably 2H or more, more preferably 3H or more, still more preferably 4H or more, particularly preferably 5H or more. Further, the viewer side surface has such scratch resistance that the viewer side surface is free of occurrence of a flaw when rubbed back and forth with a load of 1,000 g preferably 300 times, more preferably 500 times, still more preferably 1,000 times. When the pencil hardness and the scratch resistance fall within such ranges, the surface protective layer can satisfactorily function as a substitute for a cover glass. The pencil hardness may be measured in conformity to JIS K 5400-5-4. In addition, the scratch resistance may be evaluated on the basis of the state of a flaw formed when a surface is rubbed back and forth a predetermined number of times with a predetermined load (e.g., 500 g/cm$^2$ or 1,000 g/cm$^2$) using steel wool #0000.

The light transmittance of the surface protective layer is preferably 31% or more, more preferably 93% or more, still more preferably 95% or more. The haze of the surface protective layer is preferably 0.5% or less, more preferably 0.4% or less, still more preferably 0.3% or less. When the light transmittance and/or haze of the surface protective layer falls within such range, in the case of applying the optical laminate to an organic EL display apparatus, satisfactory viewability can be realized.

B-2. Hard Coat Layer

As described above, the hard coat layer 11 may be formed on one side (typically the surface side) of the resin film, may be formed on each of both sides of the resin film, or may be eliminated, depending on the configuration of the resin film 12.

The hard coat layer may be formed of any appropriate material that can satisfy the characteristics described in the section B-1. Specific examples of the constituent material include a thermosetting resin, a thermoplastic resin, an active energy ray-curable resin (e.g., a W-curable resin or an electron beam-curable resin), and a two-component resin. Of those, a UV-curable resin is preferred. This is because the hard coat layer can be efficiently formed by a simple processing operation. Examples of the UV-curable resin include various resins, such as polyester-based, acrylic, urethane-based, amide-based, silicone-based, and epoxy-based resins. Those resins each contain, for example, a UV-curable monomer, oligomer, or polymer. Of those, an acrylic resin is preferred. The UV-curable acrylic resin contains a monomer component and an oligomer component each having preferably two or more, more preferably three to six UV-polymerizable functional groups. The UV-curable resin typically has blended therein a photopolymerization initiator. A curing mode may be a radical polymerization mode, or may be a cationic polymerization mode. In one embodiment, an organic-inorganic hybrid material obtained by blending silica particles, a cage silsesquioxane compound, or the like into the constituent material may be used. The constituent material and forming method for the hard coat layer are described in, for example, JP 2011-237789 A. The description of the laid-open publication is incorporated herein by reference.

The hard coat layer may be formed by blending a slide-ring material into the constituent material. When the slide-ring material is blended, satisfactory flexibility can be imparted. A typical example of the slide-ring material is polyrotaxane. The polyrotaxane typically has a structure in which cyclodextrin (CD) cyclic molecules slide on a linear polyethylene glycol (PEG) main chain. Both ends of the PEG main chain are modified with adamantanamine to prevent the CD cyclic molecules from falling off. In the polyrotaxane to be used in the present invention, the CD cyclic molecules are each chemically modified: to have an active energy ray-polymerizable group. When the slide-ring material is used, a radically polymerizable monomer having, a radically polymerizable group is preferably used as the constituent material for the hard coat layer Examples of the radically polymerizable group include a (meth) acryloyl group and a (meth) acryloyloxy group. The radically polymerizafole monomer is preferred because the radically polymerizable monomer is excellent, in compatibility with the polyrotaxane and allows diverse material choices. When the polyrotaxane (substantially the polymerizable group of each of the CD cyclic molecules) and the active energy ray-curable component of the constituent material for the hard coat layer react with each other to be cured, there is obtained a hard coat layer in which cross-linking points are movable even after curing. As a result, a stress at the time of bending can be relaxed, and hence bending durability is improved. The polyrotaxane and the curing mechanism are described in, for example, JP 2015-155530 A. The description of the laid-open publication is incorporated herein by reference.

The hard coat layer may be formed by blending a nanofiber and/or a nanocrystal into the constituent material. Typical examples of the nanofiber include cellulose nanofiber, chitin nanofiber, and chitosan nanofiber. When those materials are blended, there can be obtained a hard coat, layer that is excellent in flexibility, pencil hardness, scratch resistance, and abrasion resistance while maintaining excellent transparency. The nanofiber and/or the nanocrystal (total thereof in the case of combined use) may be blended at a ratio of preferably from 0.1 wt % to 40 wt % with respect to the entirety of the hard coat layer. The nanofiber has an average fiber diameter of, for example, from 1 nm to 100 nm, and an average fiber length of, for example, from 10 nm to 1,000 nm. The hard coat layer containing the nanofiber is described in, for example, JP 2012-131201A and JP 2012-171171 A. The descriptions of the laid-open publications are incorporated herein by reference.

The thickness of the hard coat layer is preferably from 1 μm to 20 μm, more preferably from 2 μm to 15 μm. When the thickness is excessively small, hardness may be insufficient, and a suppressing effect on a dimensional change due to bending or the like may be insufficient. When the thickness is excessively large, bendability and/or foldability may be adversely affected.

B-3. Resin Film

The resin film may be formed of any appropriate material that, can satisfy the characteristics described in the section B-1. Specific examples of the constituent material include a polyethylene terephthalate-based resin, a polyethylene naphthalate-based resin, an acetate-based resin, a polyether sulfone-based resin, a polycarbonate-based resin, a polyamide-based resin, a polyimide-based resin, a polyamide-imide-based resin, a polyolefin-based resin, a (meth)acrylic resin, a polyvinyl chloride-based resin, a polyvinylidene chloride-based resin, a polystyrene-based resin, a polyvinyl alcohol-based resin, a polyarylate-based resin, and a polyphenylene sulfide-based resin. Those resins may be used alone or in combination thereof. Of those, a polyamide-based resin, a polyimide-based resin, a polyamide-imide-based resin, a polyethylene naphthalate-based resin, and a polycarbonate-based resin are preferred because of excellent durability.

Fine particles may be blended into the constituent material for the resin film. More specifically, the resin film may be a so-called nanocomposite film in which fine particles of the nanometer order are dispersed in a matrix made of the constituent material. With such configuration, extremely excellent hardness and scratch resistance are imparted, and hence the hard coat layer can be omitted. The average particle diameter of the fine particles is, for example, from about 1 nm to about 100 nm. The fine particles are each typically formed of an inorganic oxide. The fine particles each preferably have a surface modified with a predetermined functional group. Examples of the inorganic oxide for forming the fine particles include zirconiumoxide, yttria-doped zirconium oxide, lead zirconate, strontium titanate, tin titanate, tin oxide, bismuth oxide, niobium oxide, tantalum oxide, potassium tantalate, tungsten oxide, cerium oxide, lanthanum oxide, gallium oxide, silica, alumina, titanium oxide, and barium titanate.

The thickness of the resin film is preferably from 10 μm to 100 μm, more preferably from 10 μm to 80 μm. With such thickness, an excellent balance among thinning, a handling property, and mechanical strength is achieved.

C. Polarizer

Any appropriate polarizer may be adopted as the polarizer 20. For example, a resin film for forming the polarizer may be a single-layer resin film, or may be a laminate of two or more layers.

Specific examples of the polarizer constituted of a single-layer resin film include: a product, obtained by subjecting a hydrophilic polymer film such as a polyvinyl alcohol-based film, a partially formalized, polyvinyl alcohol-based film, or an ethylene-vinyl acetate copolymer based partially saponified film to dyeing treatment with a dichromatic substance such as iodine or a dichromatic dye and stretching treatment; and a polyene-based alignment film such as a dehydration-treated product of polyvinyl alcohol or a dehydrochlorination-treated product of polyvinyl chloride. Of those, a polarizer obtained by dyeing a polyvinyl alcohol-based film with iodine and uniaxially stretching the resultant is preferably used because of its excellent optical characteristics.

The dyeing with iodine is performed by, for example, immersing the polyvinyl, alcohol-based film in an aqueous solution of iodine. The stretching ratio of the uniaxial stretching is preferably from 3 to 7 times. The stretching may be performed after the dyeing treatment or may be performed simultaneously with the dyeing. In addition, the stretching may be performed before the dyeing. The polyvinyl alcohol-based film is subjected to, for example, swelling treatment, cross-linking treatment, washing treatment, or drying treatment as required. For example, when the polyvinyl alcohol-based film is washed with water by being immersed in water before the dyeing, the soil or antiblocking agent on the surface of the polyvinyl alcohol-based film can be washed off. In addition, the polyvinyl alcohol-based film can be swollen to prevent dyeing unevenness or the like.

The polarizer obtained by using the laminate is, for example, a polarizer obtained by using a laminate of a resin substrate and a PVA-based resin layer (PVA-based resin film) laminated on the resin substrate, or a laminate of a resin substrate and a PVA-based resin layer formed on the resin substrate through application. The polarizer obtained by using the laminate of the resin substrate and the PVA-based resin layer formed on the resin substrate through application may be produced by, for example, a method involving: applying a PVA-based resin solution onto the resin substrate; drying the solution to form the PA-based resin layer on the resin, substrate, thereby providing the laminate of the resin substrate and the PVA-based resin layer; and stretching and dyeing the laminate, to turn the PVA-based resin layer into the polarizer. In this embodiment, the stretching typically includes the stretching of the laminate under a state in which the laminate is immersed in an aqueous solution of boric acid. The stretching may further include the in-air stretching of the laminate at high temperature (e.g., 95° C. or more) before the stretching in the aqueous solution of boric acid as required. The resultant laminate of the resin substrate and the polarizer may be used as it is (i.e., the resin substrate may be used as a protective layer for the polarizer). Alternatively, a product obtained as described below may be used: the resin substrate is peeled from the laminate of the resin substrate and the polarizer, and any appropriate protective layer in accordance with purposes is laminated on the peeled surface. Details of such method of producing a polarizer are disclosed in, for example, Japanese Patent Application Laid-open No. 2012-73580. The entire disclosure of the laid-open publication is incorporated herein by reference.

The thickness of the polarizer, is preferably 15 μm or less, more preferably from 1 μm to 12 μm, still more preferably from 3 μm to 10 μm, particularly preferably from 3 μm to 8 μm. When the thickness of the polarizer falls within such range, curling at the time of heating can be satisfactorily suppressed, and satisfactory external appearance durability at the time of heating is obtained. In addition, the polarizer having such thickness can contribute to the thinning of the optical laminate (consequently of an organic EL display apparatus).

The polarizer preferably shows absorption dichroism at any wavelength in the wavelength range of from 380 nm to 780 nm. The single layer transmittance of the polarizer is preferably from 43.0% to 46.0%, more preferably from 44.5% to 46.0%. The polarization degree of the polarizer is preferably 97.0% or more, more preferably 93.0% or more, still more preferably 39.9% or more.

D. Optical Compensation Layer

D-1. Optical Compensation Layer formed of Retardation Film

When, the optical compensation layer is formed of a retardation film as illustrated, in FIG. 1, the retardation film may function as a so-called λ/4 plate. The in-plane retardation. Re (550) of the retardation film is preferably from 100 nm to 180 nm, more preferably from 135 nm to 155 nm.

As described above, the retardation film satisfies a relationship of Re (450)<Re (550)<Re (650). That is, the retardation film shows such reverse dispersion-type wavelength dependence that its retardation value increases with an increase in wavelength of measurement light. A ratio Re (450)/Re (550) of the retardation film is preferably 0.8 or more and less than 1.0, more preferably from 0.8 to 0.95. A ratio Re (550)/Re (650) of the retardation film is preferably 0.8 or more, and less than 1.0, more preferably from 0.8 to 0.97.

The retardation film typically has: a refractive index characteristic of showing a relationship of nx>ny; and therefore a slow axise. The angle formed between the slow axis of the retardation film 30 and the absorption axis of the polarizer 20 is from 35° to 55° as described above, and is more preferably from 38° to 52°, still more preferably from 42° to 48°, particularly preferably about 45°. When the angle falls within such range, an optical laminate having an extremely excellent circular polarization characteristic (consequently an extremely excellent antireflection characteristic) can be obtained by using the retardation film as a λ/4 plate.

The retardation film shows any appropriate refractive index ellipsoid as long as the film has the relationship of nx>ny. The refractive index ellipsoid of the retardation film preferably shows a relationship of nx>ny≥nz. Herein, "ny=nz" encompasses not only a case in which ny and nz are exactly equal to each other, but also a case in which ny and nz are substantially equal to each other. Therefore, a relationship of ny<nz may be satisfied without impairing the effect of the present invention. The Nz coefficient of the retardation film is preferably from 0.9 to 2, more preferably from 0.9 to 1.5, still more preferably from 0.9 to 1.3. When such relationship is satisfied, in the case of using the optical laminate for an organic EL display apparatus, an extremely excellent reflection hue can be achieved.

The absolute value of the photoelastic coefficient of the retardation film is preferably $2 \times 10^{-12}$ ($m^2/N$) or more, more preferably from $10 \times 10^{-12}$ ($m^2/N$) to $100 \times 10^{-12}$ ($m^2/N$), still more preferably from $20 \times 10^{-12}$ ($m^2/N$) to $40 \times 10^{-12}$ ($m^2/N$). When the absolute value of the photoelastic coefficient falls within such range, the bendability of the organic EL display apparatus can be maintained while a sufficient retardation is secured even when the thickness is small. Moreover, a change in retardation (consequently a change in color of the organic EL display apparatus) due to a stress at the time of bending can be further suppressed.

The thickness of the retardation film is preferably from 1 μm to 70 μm, more preferably from 1 μm to 20 μm, still more preferably from 1 μm to 10 μm. In the optical laminate of the present invention, a film having a smaller thickness than a conventional λ/4 plate can be used while desired optical characteristics are maintained, and hence a contribution can be made to the thinning of the optical laminate (consequently of an organic EL display apparatus).

The retardation film is formed of any appropriate resin capable of satisfying such characteristics as described above. Examples of the resin for forming the retardation film include a polycarbonate resin, a polyvinyl acetal resin, a cycloolefin-based resin, an acrylic resin, and a cellulose ester-based resin. Of those, a polycarbonate resin is preferred.

As the polycarbonate resin, any appropriate polycarbonate resin may be used as long as the effect of the present invention is obtained. The polycarbonate resin preferably contains: a structural unit derived from a fluorene-based dihydroxy compound; a structural unit derived from an isosorbide-based dihydroxy compound; and a structural unit, derived from at least one dihydroxy compound selected from the group consisting of an alicyclic diol, an alicyclic dimethanol, di-, tri-, or polyethylene glycol, and an alkylene glycol or spiroglycol. The polycarbonate resin more preferably contains: a structural unit derived from a fluorene-based dihydroxy compound; a structural unit derived from an isosorbide-based dihydroxy compound; and a structural unit derived from an alicyclic dimethanol and/or a structural unit derived from di-, tri-, or polyethylene glycol. The polycarbonate resin still more preferably contains: a structural unit derived from a fluorene-based dihydroxy compound; a structural unit derived from an isosorbide-based dihydroxy compound; and a structural unit derived from di-, tri-, or polyethylene glycol. The polycarbonate, resin may contain a structural unit derived from any other dihydroxy compound as required. Details of the polycarbonate resin which may be suitably used in the present invention, are disclosed in, for example, Japanese Patent Application Laid-open No. 2014-10291 and Japanese Patent Application Laid-open No. 2014-26266. The disclosures of the laid-open publications are incorporated herein by reference.

The glass transition temperature of the polycarbonate resin is preferably 110° C. or more and 250° C. or less, more preferably 120° C. or more and 230° C. or less. When the glass transition temperature is excessively low, the heat resistance of the resin tends to deteriorate and hence the resin may cause a dimensional change after its forming into a film. In addition, the image quality of a liquid crystal panel or an organic EL panel to be obtained may deteriorate. When the glass transition temperature is excessively high, the forming stability of the resin at the time of its forming into a film may deteriorate. In addition, the transparency of the film may be impaired. The glass transition temperature is determined in conformity to JIS K 7121 (1987).

The molecular weight of the polycarbonate resin may be expressed as a reduced viscosity. The reduced viscosity is measured with an Ubbelohde viscometer at a temperature of 20.0° C.±0.1° C. after precise adjustment of a polycarbonate concentration to 0.6 g/dL through the use of methylene chloride as a solvent. The lower limit of the reduced viscosity is generally preferably 0.30 dL/g, more preferably 0.35 dL/g or more. The upper limit, of the reduced viscosity is generally preferably 1.20 dL/g, more preferably 1.00 dL/g, still more preferably 0.80 dL/g. When the reduced viscosity is lower than the lower limit value, there may arise a problem of a reduction in mechanical strength of a formed article. Meanwhile, when the reduced viscosity is higher than the upper limit value, there may arise a problem in that flowability during forming is decreased to decrease productivity and formability.

The retardation film may be obtained by, for example, stretching a film formed from the polycarbonate-based resin. Any appropriate forming method may be adopted as a method of forming a film from the polycarbonate-based resin. Specific examples thereof include a compression molding method, a transfer molding method, an injection molding method, an extrusion method, a blowing method, a powder forming method, a FRP molding method, a cast coating method (such as a casting method), a calendar method, and a hot-press method. Of those, an extrusion method or a cast coating method is preferred. This is because the extrusion method or the cast coating method can increase the smoothness of the film to be obtained and provide satisfactory optical uniformity. Forming conditions may be appropriately set depending on, for example, the composition and kind of the resin, to be used, and the desired characteristics of the retardation layer. As described above, for the polycarbonate-based resin, many film products are commercially available, and hence the commercially available films may each be subjected to stretching treatment.

The thickness of the resin film (unstretched film) may be set to any appropriate value depending on, for example, the desired thickness and desired optical characteristics of the retardation film to be obtained, and stretching conditions to be described later. The thickness is preferably from 50 μm to 300 μm.

Any appropriate stretching method and stretching conditions (such as a stretching temperature, a stretching ratio, and a stretching direction) may be adopted for the stretching. Specifically, one kind of various stretching methods, such as free-end stretching, fixed-end stretching, free-end shrinkage, and fixed-end shrinkage, may be employed alone, or two or more kinds thereof may be employed simultaneously or sequentially. With regard to the stretching direction, the stretching may be performed in various directions or dimensions, such as a lengthwise direction, a widthwise direction, a thickness direction, and an oblique direction.

A retardation film having the desired optical characteristics (such as a refractive index characteristic, an in-plane retardation, and an NZ coefficient) can be obtained by appropriately selecting the stretching method and stretching conditions.

In one embodiment, the retardation film is produced by subjecting a resin film to uniaxial stretching or fixed-end uniaxial stretching. The fixed-end uniaxial stretching is specifically, for example, a method involving stretching the resin film in its widthwise direction (lateral direction) while running the film in its lengthwise direction. The stretching ratio is preferably from 1.1 times to 3.5 times.

In another embodiment, the retardation film may be produced by continuously subjecting a resin film having an elongate shape to oblique stretching in a direction of a predetermined angle with respect to a lengthwise direction. When the oblique stretching is adopted, a stretched film having an elongate shape and having an alignment angle which is the predetermined angle with respect to the lengthwise direction of the film (having a slow axis in the direction of the predetermined angle) is obtained, and for example, roll-to-roll operation can be performed in its lamination with the polarizer, with the result that the manufacturing process can be simplified. The predetermined angle may be an angle formed by the absorption axis of the polarizer and the slow axis of the optical compensation layer in the optical laminate. As described above, the angle θ is preferably from 35° to 55°, more preferably from 38° to 52°, still more preferably from 42° to 48°, particularly preferably about 45°.

As a stretching machine to be used for the oblique stretching, for example, there is given a tenter stretching machine capable of applying feeding forces, or tensile forces or take-up forces, having different speeds on left and right sides in a lateral direction and/or a longitudinal direction. Examples of the tenter stretching machine include a lateral uniaxial stretching machine and a simultaneous biaxial stretching machine, and any appropriate stretching machine may be used as long as the resin film having an elongate shape can be continuously subjected to the oblique stretching.

Through appropriate control of each of the speeds on the left and right sides in the stretching machine, a retardation film (substantially a retardation film having an elongate shape) having the desired in-plane retardation and having a slow axis in the desired direction can be obtained.

As a method for the oblique stretching, there are given, for example, methods described in JP 50-83482 A, JP 02-113920 A, JP 03-182701 A, JP 2000-9912 A, JP 2002-86554 A, JP 2002-22944 A, and the like.

The stretching temperature of the film may be changed depending on, for example, the desired in-plane retardation value and thickness of the retardation film, the kind of the resin to be used, the thickness of the film to be used, and a stretching ratio. Specifically, the stretching temperature is preferably from Tg−30° C. to Tg+30° C., more preferably from Tg−15° C. to Tg+15° C., most preferably from Tg−10° C. to Tg+10° C. When the stretching is performed at such temperature, a retardation film having characteristics which are appropriate in the present invention can be obtained. Tg refers to the glass transition temperature of the constituent material for the film.

A commercially available film may be used as a polycarbonate-based resin film. Specific examples of the commercially available product include products available under the trade names "PURE-ACE WR-S", "PURE-ACE WR-W", and "PORE-ACE WR-M" from Teijin Limited, and a product available under the trade name "NRF" from Nitto Denko Corporation. The commercially available film may be used as it is, or the commercially available film may be subjected to secondary processing (e.g., stretching treatment or surface treatment) before use depending on purposes.

D-2. Optical Compensation Layer formed of Laminate of Liquid Crystal Alignment Fixed Layers D-2-1. First Liquid Crystal Alignment Fixed Layer The first liquid crystal, alignment fixed layer 31 may function as a so-called λ/2 plate. An optical laminate having an excellent, circular polarization characteristic in a wide band can be obtained by using the first liquid crystal alignment fixed layer as the so-called λ/2 plate, using the second liquid crystal alignment fixed layer to be described later as a so-called λ/4 plate, and setting their slow axes to predetermined directions with respect to the absorption axis of the polarizer. The in-plane retardation Re (550) of the first liquid crystal alignment fixed layer is preferably from 180 nm to 320 nm, more preferably from 200 nm to 290 nm, still more preferably from 230 nm to 280 nm.

The refractive index ellipsoid of the first liquid crystal alignment fixed layer typically shows a relationship of nx>ny=nz. The angle formed between the slow axis of the first liquid crystal alignment fixed layer 31 and the absorption axis of the polarizer 20 is preferably from 10° to 20° as described above, and is more preferably from 13° to 17°, still more preferably about 15°. When the angle formed between the slow axis of the first liquid crystal alignment fixed layer and the absorption axis of the polarizer falls within such range, an optical laminate having an extremely excellent circular polarization characteristic (consequently an extremely excellent antireflection characteristic) in a wide band can be obtained by setting each of the in-plane retardations of the first liquid crystal alignment fixed layer and the second liquid, crystal alignment fixed layer to a predetermined range, and arranging the slow axis, of the second liquid crystal alignment, fixed, layer at a predetermined angle as described later with respect to the absorption axis of the polarizer.

The thickness of the first liquid crystal alignment fixed layer is preferably from 1 μm to 7 μm, more preferably from 1.5 μm to 2.5 μm. As described above, when the liquid crystal compounds are used, the difference between nx and ny of the optical compensation layer to be obtained can be markedly increased as compared to non-liquid crystal materials, and hence the layer thickness for obtaining a desired in-plane retardation can be markedly reduced. Accordingly, an in-plane retardation comparable to that of a resin film can be realized with a markedly smaller thickness than that of the resin film.

In this embodiment, a rod-shaped liquid crystal compound is typically aligned in a state of being aligned in the predetermined direction in the first liquid crystal alignment fixed layer (homogeneous alignment). An example of the liquid crystal compound is a liquid crystal compound whose liquid crystal phase is a nematic phase (nematic liquid crystal). As such liquid crystal compound, for example, a liquid crystal polymer or a liquid crystal monomer may be used. The expression mechanism of the liquid crystallinity of the liquid crystal compound may be lyotropic or thermotropic. The liquid crystal polymer and the liquid crystal monomer may each be used alone, or may be used in combination.

When the liquid crystal compound is the liquid crystal monomer, the liquid crystal monomer is preferably a polymerizable monomer or a cross-linkable monomer. This is because the alignment state of the liquid crystal monomer can be fixed by polymerizing or cross-linking (that is, curing) the liquid, crystal monomer. After the alignment of the liquid crystal monomer, for example, when molecules of the liquid crystal monomer are polymerized or cross-linked with each other, the alignment state can be fixed as a result. In this case, a polymer is formed through the polymerization and a three-dimensional network structure is formed through the cross-linking, and the polymer and the structure are non-liquid crystalline. Therefore, the formed first liquid crystal alignment fixed layer does not undergo, for example, a transition caused by a temperature change to a liquid crystal phase, a glass phase, or a crystal phase, which is peculiar to a liquid crystalline compound. As a result, the first liquid crystal alignment fixed layer becomes a layer which is extremely excellent in stability without being affected by a temperature change.

The temperature range in which the liquid crystal monomer shows liquid crystal Unity varies, depending on its kind. Specifically, the temperature range is preferably from 40° C. to 120° C., more preferably from 50° C. to 100° C., most preferably from 60° C. to 90° C.

Any appropriate liquid crystal monomer may be adopted as the liquid crystal monomer. For example, a polymerisable mesogenic compound and the like disclosed in Japanese Patent Translation Publication No. 2002-533742 (WO 00/37585) EP 358208 (U.S. Pat. No. 5,211,877), EP 66137 (U.S. Pat. No. 4,388,453), WO 93/22397, EP 0261712, DE 19504224, DE 4408171, GB 2280445, and the like may be used. Specific examples of such polymerizable mesogenic compound; include a product available under the trade name LC242 from BASF SE, a product available under the trade name E7 from Merck KGaA, and a product available under the trade name LC-Sillicon-CC3767 from Wacker Chemie AG. The liquid crystal monomer is preferably, for example, a nematic liquid crystal monomer.

The first liquid crystal alignment fixed layer may be formed by: subjecting the surface of a predetermined substrate to alignment treatment; applying an application liquid containing a liquid crystal compound onto the surface; aligning the liquid crystal compound in a direction corresponding to the alignment treatment; and fixing the alignment state. When such alignment treatment is used, the liquid crystal compound can be aligned in a predetermined direction with respect to the elongate direction of an elongate, substrate, and as a result, a slow axis can be expressed in a predetermined direction of the liquid crystal alignment fixed layer to be formed. For example, a liquid crystal alignment fixed layer having a slow axis in a direction of 15° with respect to the elongate direction can be formed on the elongate substrate. Even when desired to have a slow axis in an oblique direction, such liquid crystal alignment fixed layer can be laminated using a roll-to-roll process, and hence can markedly improve the productivity of the optical laminate. In one embodiment, the substrate is any appropriate resin film, and the alignment fixed layer formed on the substrate may be transferred onto the surface of the polarizer. In another embodiment, the substrate may be the inner protective layer (inner protective film). In this case, the transfer step is omitted, and hence lamination can be performed by a roll-to-roll process continuously from the formation of the alignment fixed layer.

As the alignment treatment, any appropriate alignment treatment may be adopted. Specific examples thereof include mechanical alignment treatment, physical alignment treatment, and chemical alignment treatment. Specific examples of the mechanical alignment treatment include rubbing treatment and stretching treatment. Specific examples of the physical alignment treatment include magnetic field alignment treatment and electric field alignment treatment. Specific examples of the chemical alignment treatment include an oblique deposition method and photoaligment treatment. Any appropriate conditions may be adopted as treatment conditions for the various alignment treatments depending on purposes.

The alignment of the liquid crystal compound is performed through treatment at a temperature at which the liquid crystal compound shows a liquid crystal phase depending on the kind of the liquid crystal compound. When the treatment at such temperature is performed, the liquid crystal compound adopts a liquid crystal state, and the liquid crystal compound is aligned depending on the alignment treatment direction of the surface of the substrate.

In one embodiment, the fixation of the alignment state is performed by cooling the liquid crystal compound aligned as described above. When the liquid crystal compound is the polymerizable monomer or the cross-linkable monomer, the fixation of the alignment state is performed by subjecting the liquid crystal compound aligned as described above to polymerization treatment or cross-linking treatment.

Specific examples of the liquid crystal compound and details of the method of forming the alignment fixed layer are disclosed in Japanese Patent Application Laid-open. No. 2006-163343. The disclosure of the laid-open publication is incorporated herein by reference.

D-2-2. Second Liquid Crystal Alignment Fixed Layer

The second liquid crystal alignment, fixed layer 32 may function as a so-called λ/4 plate. An optical laminate having an excellent circular polarization characteristic in a wide band can be obtained by using the second liquid crystal alignment fixed layer as the so-called λ/4 plate, using the first liquid crystal alignment fixed layer as the so-called λ/2 plate as described above, and setting their slow axes to predetermined directions with respect to the absorption axis of the polarizer. The in-plane retardation Re (550) of the second liquid crystal alignment fixed layer is preferably from 100 nm to 180 nm as described above, and is more preferably from 110 nm to 170 nm, still more preferably from 120 nm to 160 nm.

The refractive index ellipsoid of the second liquid crystal alignment fixed layer typically shows a relationship of nx>ny=nz. The angle formed between the slow axis of the second liquid crystal alignment fixed layer 32 and the absorption axis of the polarizer 20 is preferably from 65° to 85° as described above, and is more preferably from 72° to 78°, still more preferably about 75°. When the angle formed between the slow axis of the second liquid crystal alignment fixed layer and the absorption axis of the polarizer falls within such range, an optical laminate having an extremely excellent circular polarization characteristic (consequently an extremely excellent antireflection characteristic) in a wide band can be obtained by setting each of the in-plane retardations of the first liquid crystal, alignment fixed layer and the second liquid crystal alignment fixed layer to a predetermined range, and arranging the slow axis of the first liquid crystal alignment fixed layer at a predetermined angle as described above with respect to the absorption axis of the polarizer.

The thickness of the second liquid crystal alignment fixed layer is preferably from 0.5 μm to 2 μm, more preferably from 1 μm to 1.5 μm.

The constituent material, characteristics, production method, and the like of the second liquid crystal, alignment fixed layer are as described in the Section D-2-1 for the first liquid crystal alignment fixed layer.

Although an embodiment in which the angle formed between the slow axis of the first liquid crystal alignment fixed layer 31 and the absorption axis of the polarizer 20 is about 15°, and in which the angle formed between the slow axis of the second liquid crystal alignment fixed layer 32 and the absorption axis of the polarizer 20 is about 15° has been described, the axis angle relationships may be reversed as described in the section A. Specifically, the angle formed: between the slow axis of the first liquid crystal alignment fixed layer 31 and the absorption axis of the polarizer 20 may be preferably from 65° to 85°, more preferably from 72° to 78°, still more preferably about 75°. In this ease, the angle formed between the slow axis of the second liquid crystal alignment fixed layer 32 and the absorption axis of the polarizer 20 may be preferably from 10° to 20°, more preferably from 13° to 17°, still more preferably about 15°.

E. Conductive Layer

The conductive layer (not shown) is typically transparent (that is, the conductive layer is a transparent conductive layer). When the conductive layer is formed on the opposite side of the optical compensation layer to the polarizer, the optical laminate can be applied to a so-called inner touch panel-type input display apparatus, which includes a built-in touch sensor between a display cell (organic EL cell) and a polarizer.

The conductive layer may be used alone as a constituent layer of the optical laminate, or may be laminated as a laminate with a substrate (conductive layer with a substrate) on the optical compensation layer. When the configuration in which the conductive layer is used alone is adopted, the conductive layer may be transferred onto the optical compensation layer from a substrate on which the conductive layer has been formed.

The conductive layer may be patterned as required. Through the patterning, a conductive part and an insulating part may be formed. As a result, an electrode may be formed. The electrode may function as a touch sensor electrode for detecting contact on a touch panel. The shape of the pattern is preferably a pattern that satisfactorily operates as a touch panel (e.g., a capacitance-type touch panel. Specific examples thereof include patterns described in, for example, JP 2011-511357 A, JP 2010-164938 A, JP 2008-310550 A, JP 2003-511799 A, and JP 2010-541109 A.

The total light transmittance of the conductive layer is preferably 80% or more, more preferably 85% or more, still more preferably 90% or more. For example, when a conductive nanowire to be described later is used, a transparent conductive layer having formed therein an opening can be formed, and hence a transparent conductive layer having a high light transmittance can be obtained.

The density of the conductive layer is preferably from 1.0 $g/cm^3$ to 10.5 $g/cm^3$, more preferably from 1.3 $g/cm^3$ to 3.0 $g/cm^3$.

The surface resistance value of the conductive layer is preferably from 0.1Ω/□ to 1,000Ω/□, more preferably from 0.5Ω/□ to 500Ω/□, still more preferably from 1Ω/□ to 250 Ω/□.

Typical examples of the conductive layer include: a conductive layer including a metal oxide, a conductive layer including a conductive nanowire, and a conductive layer including a metal mesh. Of those, a conductive, layer including a conductive, nanowire or a conductive layer including a metal mesh is preferred. This is because such material is excellent in bending resistance and hardly loses conductivity even when bent, and hence a conductive layer capable of being satisfactorily bent can be formed.

The conductive layer including a metal oxide may be formed by forming a metal oxide film on any appropriate substrate by any appropriate film forming method (e.g., a vacuum deposition method, a sputtering method, a CVD method, an ion plating method, or a spraying method). Examples of the metal oxide include indium oxide, tin oxide, zinc oxide, indium-tin composite oxide, tin-antimony composite oxide, zinc-aluminum composite oxide, and indium-zinc composite oxide. Of those, indium-tin composite oxide (ITO) is preferred.

The conductive layer including a conductive nanowire may be formed by applying a dispersion liquid obtained by dispersing the conductive nanowire in a solvent (conductive nanowire dispersion liquid) onto any appropriate substrate, and then drying the applied layer. Any appropriate conductive nanowire may be used as the conductive nanowire as long as the effect of the present invention is obtained. The conductive nanowire refers to a conductive substance that has a needle- or thread-like shape and has a diameter of the order of nanometers. The conductive nanowire may be linear or may be curved. As described above, the conductive layer including the conductive nanowire is excellent in bending resistance. In addition, when the conductive layer including the conductive nanowire is used, pieces of the conductive nanowire form a gap therebetween to be formed into a network shape. Accordingly, even when a small amount of the conductive nanowire is used, a good electrical conduction path can be formed and hence a conductive layer having a small electrical resistance can be obtained. Further, the conductive nanowire is formed into a network shape, and hence an opening portion is formed in a gap of the network. As a result, a conductive layer having a high light transmittance can be obtained. Examples of the conductive nanowire include a metal nanowire containing a metal and a conductive nanowire including a carbon nanotube.

A ratio (aspect ratio: L/d) between a thickness d and a length L of the conductive nanowire is preferably from 10 to 100,000, more preferably from 50 to 100,000, still more preferably from 100 to 10,000. When a conductive nanowire having such large aspect ratio is used, the conductive nanowire satisfactorily intersects with itself and hence high conductivity can be expressed with a small amount of the conductive nanowire. As a result, a conductive layer having a high light transmittance can be obtained. The term "thickness: of the conductive: nanowire" as used herein has the following meanings: when a section of the conductive nanowire has a circular shape, the term means the diameter of the circle; when the section has an elliptical shape, the term means the short diameter of the ellipse; and when the section has a polygonal shape, the term means the longest diagonal of the polygon. The thickness and length of the conductive nanowire may be observed with a scanning electron microscope or a transmission electron microscope.

The thickness of the conductive nanowire is preferably less than 500 nm, more preferably less than 200 nm, still more preferably from 1 nm to 100 nm, particularly preferably from 1 nm to 50 nm. When the thickness falls within such range, a conductive layer having a high light transmittance can be formed. The length of the conductive nanowire is preferably from 2.5 μm to 1,000 μm, more preferably from 10 μm to 500 μm, still more preferably from 20 μm to 100 μm. When the length falls within such range, a conductive layer having high conductivity can be obtained.

Any appropriate metal may be used as a metal for forming the conductive nanowire (metal nanowire) as long as the metal has high conductivity. The metal nanowire is preferably formed of one or more kinds of metals selected from the group consisting of gold, platinum, silver, and copper. Of those, silver, copper, or gold is preferred from the viewpoint of conductivity, and silver is more preferred. In addition, a material obtained by subjecting the metal to metal plating (e.g., gold plating) may be used.

Any appropriate carbon nanotube may be used as the carbon nanotube. For example, a so-called multi-walled carbon nanotube, double-walled carbon nanotube, or single-walled carbon nanotube is used. Of those, a single-walled carbon nanotube is preferably used because of its high conductivity.

As the metal mesh, any appropriate metal mesh may be used as long as the effect of the present invention is obtained. For example, there may be used a metal wiring layer arranged on a film substrate and formed into a mesh pattern.

Details of the conductive nanowire and the metal mesh are described in, for example, JP 2014-113705 A and JP 2014-219667 A. The descriptions of the laid-open publications are incorporated herein by reference.

The thickness of the conductive layer is preferably from 0.01 μm to 10 μm, more preferably from 0.05 μm to 3 μm, still more preferably from 0.1 μm to 1 μm. When the thickness falls within such range, a conductive layer excellent in conductivity and light transmittance can be obtained. When the conductive layer includes the metal oxide, the thickness of the conductive layer is preferably from 0.01 μm to 0.05 μm.

F. Printed Layer

As described above, the printed layer is formed at the peripheral portion of the optical laminate, more specifically the position corresponding to the bezel of an organic EL display apparatus in plan view. Also as described above, the printed layer may be formed on the polarizer 20 side of the surface protective layer 10 (substantially the polarizer 20 side of the resin film 12), or may be formed on the opposite side of the optical compensation layer 30 to the polarizer 20. The printed layer may be a design layer provided with a predetermined design, or may be a solid colored layer. The printed layer is preferably a solid colored layer, more preferably a black colored layer. When the black colored layer is formed at the position corresponding to the bezel, a non-display region can be concealed, and hence an organic EL display apparatus using no bezel can be realized through the use of the optical laminate according to this embodiment. As a result, an organic EL display apparatus having an extremely excellent external appearance without any step on its outermost surface can be provided. Further, when the printed layer is formed on the optical compensation layer, the following advantage is obtained: That is, with such configuration, the printed layer is inevitably arranged below the polarizer (on the organic EL display apparatus side), and as a result, reflected light at an interface of the printed layer is reduced by the polarizer. Therefore, an organic EL display apparatus having a more excellent external appearance can be realized.

The printed layer may be formed by any appropriate printing method using any appropriate ink or paint. Specific examples of the printing method include gravure printing, offset printing, silkscreen printing, and transfer printing from a transfer sheet.

The ink or paint to be used typically contains a binder, a colorant, a solvent, and any appropriate additive that may be used as required. Examples of the binder include chlorinated polyolefins (e.g., chlorinated polyethylene and chlorinated polypropylene), a polyester-based resin, a urethane-based resin, an acrylic resin, a vinyl acetate resin, a vinyl chloride-vinyl acetate copolymer, and a cellulose-based resin. The binder resins may be used alone or in combination thereof. In one embodiment, the binder resin is a thermally polymerizable resin. The thermally polymerizable resin only needs to be used in a small amount as compared to a photopolymerizable resin, and hence the use amount of the colorant (colorant content in the colored layer) can be increased. As a result, particularly when the black colored layer is formed, a colored layer having an extremely low total light transmittance and having an excellent concealing property can be formed. In one embodiment, the binder resin is an acrylic resin, preferably an acrylic resin containing a polyfunctional monomer (e.g., pentaerythritol triacrylate) as a copolymerizaition component. When the acrylic resin containing a polyfunctional monomer as a copolymerization component is used, a colored layer having an appropriate modulus of elasticity can be formed, and hence blocking can be satisfactorily prevented in the case where the optical laminate is rolled into a roll shape. Besides, a step resulting from the thickness of the printed layer is formed, and the step can effectively function in preventing the blocking.

Any appropriate colorant may be used as the colorant depending on purposes. Specific examples of the colorant include: inorganic pigments, such as titanium white, zinc white, carbon black, iron black, iron oxide red, chrome vermilion, ultramarine, cobalt blue, chrome yellow, and titanium yellow; organic pigments or dyes, such as phthalocyanine blue, indanthrene blue, isoindolinone yellow, benzidine yellow, quinacridone red, polyazo red, perylene red, and aniline black; metal pigments formed of scale-like foil pieces of aluminum, brass, and the like; and pearlescent pigments (pearl pigments) formed of scale-like foil pieces of titanium dioxide-coated mica, basic lead carbonate, and the like. When the black colored layer is formed, carbon black, iron black, or aniline black is suitably used. In this case, the colorants are preferably used in combination thereof. This is because: by absorbing visible light in a vide range and uniformly, a colored layer having no hue (that is, being jet black) can be formed. For example, in addition to the above-mentioned, colorant, an azo compound and/or a quinone compound may be used. In one embodiment, the colorant contains the carbon black as a main component and another colorant (e.g., an azo compound and/or a quinone compound). According to such configuration, a colored layer having no hue and being excellent in temporal stability can be formed. When the black colored layer is formed, the colorant may be used at a ratio of preferably from 50 parts by weight to 200 parts by weight with respect to 100 parts by weight of the binder resin. In this case, the content of the carbon black in the colorant is preferably from 80% to 100%. When the colorant (in particular, the carbon black) is used at such ratio, a colored layer having an extremely low total light transmittance and being excellent in temporal stability can be formed.

The thickness of the printed layer is preferably from 3 μm to 5 μm. Further, the printed layer has a total light transmittance at a thickness of from 3 μm to 5 μm of preferably 0.01% or less, more preferably 0.008% or less. When the total light transmittance falls within such range, a non-display region of an organic EL display apparatus can be satisfactorily concealed without using a bezel.

G. Inner Protective Layer (Inner Protective Film)

When the inner protective layer (inner protective film: not shown) is arranged, it is preferred that the inner protective film be optically isotropic. The phrase "be optically isotropic" as used herein refers to having an in-plane retardation Re (550) of from 0 nm to 10 nm and a thickness direction retardation Rth (550) of from −10 nm to +10 nm.

The thickness of the inner protective film is preferably from 20 μm to 200 μm, more preferably from 30 μm to 100 μm, still more preferably from 35 μm to 95 μm.

The inner protective film is formed of any appropriate film as long as the desired characteristics are obtained. As a material serving as a main component of the film, there are specifically given, for example, cellulose-based resins, such as triacetylcellulose (TAC), and transparent resins, such as polyester-based, polyvinyl alcohol-based, polycarbonate-based, polyamide-based, polyimide-based, polyether sulfone-based, polysulfone-based, polystyrene-based, polynorbornene-based, polyolefin-based, (meth) acrylic, and acetate-based resins. There are also given, for example, thermosetting resins or UV-curable resins, such as (meth) acrylic, urethane-based, (meth) acrylic urethane-based, epoxy-based, and silicone-based resins. There are also given, for example, glassy polymers, such as a siloxane-based polymer. In addition, a polymer film described in JP 2001-343529 A (WO 01/37007 A1) may be used. For example, a resin composition containing a thermoplastic resin having a substituted or unsubstituted imide group on a side chain thereof, and a thermoplastic resin having a substituted or unsubstituted phenyl group and a nitrile group on side chains thereof may be used as a material for the film, and the composition is, for example, a resin composition containing an alternating copolymer formed of isobutene and N-methylmaleimide, and an acrylonitrile-styrene copolymer. The polymer film may be, for example, an extrudate of the resin composition.

H. Pressure-Sensitive Adhesive Layer or Adhesive Layer

Any appropriate pressure-sensitive adhesive layer or adhesive layer is used for the lamination of the constituent layers of the optical laminate of the present invention. More specifically, the surface protective layer and the polarizer are laminated through the intermediation of the pressure-sensitive adhesive layer or the adhesive layer. For lamination other than the lamination of the surface protective layer and the polarizer, a pressure-sensitive adhesive layer may be typically used. For convenience, the pressure-sensitive adhesive layer to be used for the lamination of the surface protective layer and the polarizer is hereinafter referred to simply as pressure-sensitive adhesive layer, and the pressure-sensitive adhesive layer to be used for lamination other than the lamination of the surface protective layer and the polarizer is referred to other pressure-sensitive adhesive layer.

As a pressure-sensitive adhesive for forming the pressure-sensitive adhesive layer, there are given, for example, an acrylic pressure-sensitive adhesive, a rubber-based pressure-sensitive adhesive, a vinyl alkyl ether-based pressure-sensitive adhesive, a silicone-based pressure-sensitive adhesive, a polyester-based pressure-sensitive adhesive, a polyamide-based pressure-sensitive adhesive, a urethane-based pressure-sensitive adhesive, a fluorine-based pressure-sensitive adhesive, an epoxy-based pressure-sensitive adhesive, and a polyether-based pressure-sensitive adhesive. The pressure-sensitive adhesives may be used alone or in combination thereof. Of those, an acrylic pressure-sensitive adhesive is preferably used from the viewpoints of transparency, processability, durability, and the like.

The thickness of the pressure-sensitive adhesive layer is typically from 10 µm to 250 µm, preferably from 10 µm to 150 µm. The pressure-sensitive adhesive layer may be a single layer, or may have a laminated structure.

The storage modulus of elasticity (G') of the pressure-sensitive adhesive layer is preferably from 0.01 (MPa) to 1.00 (MPa), more preferably from 0.05 (MPa) to 0.50 (MPa) at 25° C. When the storage modulus of elasticity of the pressure-sensitive adhesive layer fails within such range, an optical laminate having extremely excellent bendability can be obtained. As a result, a bendable or foldable organic EL display apparatus can be realized.

An adhesive of any appropriate form may be adopted as an adhesive for forming the adhesive layer. Specific examples thereof include an aqueous adhesive, a solvent-type adhesive, an emulsion-based adhesive, a solvent-free adhesive, an active energy ray-curable adhesive, and a thermosetting adhesive. Examples of the active energy ray-curable adhesive include an electron beam-curable adhesive, a UV-curable adhesive, and a visible light-curable adhesive. Of those, an aqueous adhesive and an active energy ray-curable adhesive may be suitably used. Specific examples of the aqueous adhesive include an isocyanate-based adhesive, a polyvinyl alcohol-based adhesive, a gelatin-based adhesive, a vinyl-based adhesive, latex-based adhesive, aqueous polyurethane, and aqueous polyester. A specific example of the active energy ray-curable adhesive is a (meth)acrylate-based adhesive. The "(meth)acrylate" means acrylate and/or methacrylate. In the (meth)acrylate-based adhesive, examples of the curable component include a compound having a (meth)acryloyl group and a compound having a vinyl group. In addition, as a cationic polymerization-curable adhesive, a compound having epoxy groups or oxetanyl groups may also be used. The compound having epoxy groups is not particularly limited as long as the compound has at least two epoxy groups in the molecule, and generally known various curable epoxy compounds may be used. Preferred examples of the epoxy compounds include: a compound having, in the molecule, at least two epoxy groups and at least one aromatic ring (aromatic epoxy compound); and a compound having, in the molecule, at least two epoxy groups, at least one of which is formed between two adjacent constituent carbon atoms of an alicyclic ring (alicyclic epoxy compound).

The storage modulus of elasticity of the adhesive layer is preferably $1.0 \times 10^6$ Pa or more, more preferably $1.0 \times 10^7$ Pa or more in a region of 70° C. or less. The upper limit of the storage modulus of elasticity of the adhesive layer is, for example, $1.0 \times 10^{10}$ Pa. The storage modulus of elasticity of the adhesive layer influences polarizer cracking in the application of a heat cycle (e.g., from −40° C. to 80° C.) to the optical laminate. When the storage modulus of elasticity is low, the problem of polarizer cracking is liable to occur. The adhesive layer has a high storage modulus of elasticity in a temperature region of more preferably 80° C. or less, still more preferably 90° C. or less.

The thickness of the adhesive layer is typically from 0.01 µm to 7 µm, preferably front 0.01 µm to 5 µm.

As a pressure-sensitive adhesive for forming the other pressure-sensitive adhesive layer, there is given an acrylic, pressure-sensitive adhesive. It is preferred that the surface of the other pressure-sensitive adhesive layer arranged on the outer side of the optical compensation layer (if present, the conductive layer) have bonded thereto a separator until the optical laminate is used.

I. Organic EL Display Apparatus

Figure 3:
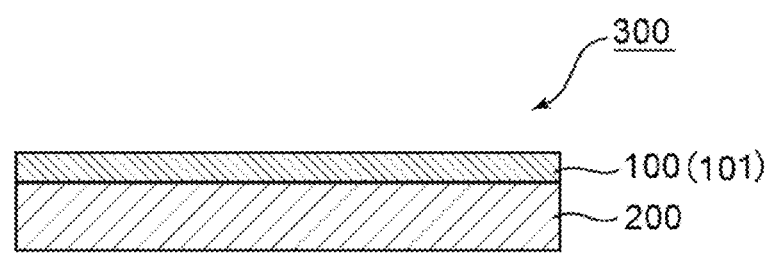
FIG. 3 is a schematic sectional view of an organic EL display apparatus according to one embodiment of the present invention.

An organic EL display apparatus is described as an example of an image display apparatus to which the optical laminate of the present invention may be applied. As described above, the optical laminate of the present invention may also be applied to a liquid crystal display apparatus. FIG. 3 is a schematic sectional view of an organic EL display apparatus according to one embodiment of the present invention. An organic EL display apparatus 300 includes an organic EL device (organic EL display cell) 200 and the optical laminate 100 or 101 on the viewer side of the organic EL device 200. The optical laminate is the optical laminate of the present invention described in the section A to the section H. The optical laminate is laminated so that the optical compensation layer may be on the organic EL device side (so that the surface protective layer may be on the viewer side). The optical laminate is not limited to the optical laminate 100 or 101, and may be an optical laminate according to still another embodiment of the present invention (not shown).

The organic EL display apparatus is preferably bendable. A bendable organic EL display apparatus can be realized by combining the optical laminate of the present invention with a bendable organic EL device to be described later. More specifically, at least part of the organic EL display apparatus is bendable with a radius of curvature of preferably 10 mm or less, more preferably 8 mm or less. The organic EL display apparatus is bendable at any appropriate portion. For example, the organic EL display apparatus may be bendable at a central portion thereof like a folding display apparatus, or may be bendable at an end portion thereof from the viewpoint of securing a design property and a display screen to the fullest. Further, the organic EL display apparatus may be bendable along its lengthwise direction, or may be bendable along its transverse direction. Needless to say, a specific portion of the organic EL display apparatus only needs to be bendable (e.g., part or all of its four corners are bendable in oblique directions) depending on applications.

When the optical laminate 100 is used (when the optical compensation layer is formed of the retardation film 30), the optical laminate 100 may be arranged so that the slow axis direction of the retardation film 30 may be preferably from 20° to 70°, more preferably from 30° to 60°, still more preferably from 40° to 50°, particularly preferably about 45° with respect to the bending direction of the organic EL display apparatus. When the optical laminate 101 is used (when the optical compensation layer has the laminated structure of the first liquid crystal, alignment, fixed layer 31 and the second liquid crystal alignment fixed layer), the optical laminate 101 may be arranged so that the slow axis direction of the first liquid crystal alignment fixed layer 31 may be preferably from 10° to 20°, more preferably from 11° to 19°, still more preferably from 12° to 18°, particularly preferably about 15° with respect to the bending direction of the organic EL display apparatus. In the is case, the slow axis direction of the second liquid crystal alignment fixed layer 32 is preferably from 70° to 80°, more preferably from 71° to 79°, still more preferably from 72° to 78°, particularly preferably about 75° with respect to the bending direction of the organic EL display apparatus. The first liquid crystal alignment fixed layer 31 and the second liquid crystal alignment fixed layer 32 are extremely thin and little influenced by bending, and hence the adjustment of their axis angles does not need to be as precise as that in the case of the retardation film. In each of the embodiments, through the adjustment of the relationship between the slow axis direction of the optical compensation layer and the bending direction of the organic EL display apparatus, a bendable organic EL display apparatus in which a change in color due to bending is suppressed can be obtained. In one embodiment, the bending direction of the organic EL display apparatus 300 (or the organic EL device 200) is a longitudinal direction or a direction perpendicular to the longitudinal direction (transverse direction). In such embodiment, when the absorption axis of the polarizer 20 of the optical laminate is set perpendicular or parallel to the longitudinal direction (or the transverse direction), in the lamination on the organic EL device, the position of the slow axis of the optical compensation layer does not need to be adjusted, and only the position of the absorption axis direction of the polarizer needs to be adjusted. In this manner, the organic EL display apparatus can be manufactured by a roll-to-roll process.

J. Organic EL Device

Figure 4:
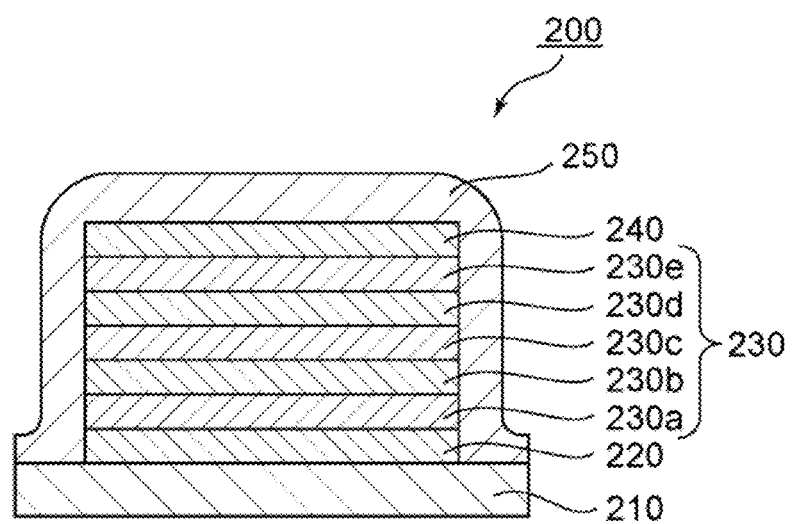
FIG. 4 is a schematic sectional view of an organic EL device to be used in an organic EL display apparatus according to one embodiment of the present invention.

Any appropriate organic EL device may be adopted as the organic EL device 200 as long as the effects of the present invention are obtained. FIG. 4 is a schematic sectional view for illustrating one mode of the organic EL device to be used in the present invention. The organic EL device 200 typically includes a substrate 210, a first electrode 220, an organic EL layer 230, a second electrode 240, and a sealing layer 250 for covering these components. The organic EL device 200 may further include any appropriate layer as required. For example, a planarizing layer (not shown) may be provided on the substrate, or an insulating layer (not shown) for preventing a short circuit may be provided between the first electrode and the second electrode.

The substrate 210 may be formed of any appropriate material as long as the substrate 210 is bendable with the above-mentioned predetermined radius of curvature. The substrate 210 is typically formed of a material having flexibility. The use of the substrate having flexibility enables the below-described advantage in addition to the above-mentioned effect of the present invention: when an optical laminate having an elongate shape is used, the organic EL display apparatus can be manufactured by the so-called roll-to-roll process, and hence can be mass-produced at low cost. Further, the substrate 210 is preferably formed of a material having a barrier property. Such substrate can protect the organic EL layer 230 from oxygen or moisture. Specific examples of the material having a barrier property and flexibility include thin glass provided with flexibility, a film of a thermoplastic resin or thermosetting resin provided with a barrier property, an alloy, and a metal. Examples of the thermoplastic resin or the thermosetting resin include a polyester-based resin, a polyimide-based resin, an epoxy-based resin, a polyurethane-based resin, a polystyrene-based resin, a polyolefin-based resin, a polyamide-based resin, a polycarbonate-based resin, a silicone-based resin, a fluorine-based resin, and an acrylonitrile-butadiene-styrene copolymer resin. Examples of the alloy include stainless steel, alloy 36, and alloy 42. Examples of the metal include copper, nickel, iron, aluminum, and titanium. The thickness of the substrate is preferably from 5 µm to 500 µm, more preferably from 5 µm to 300 µm, still more preferably from 10 µm to 200 µm. With such thickness, the organic EL display apparatus can be made bendable with the above-mentioned predetermined radius of curvature, and an excellent balance is obtained among flexibility, handleability, and mechanical strength. In addition, the organic EL device can be suitably used in the roll-to-roll process.

The first electrode 220 can typically function as an anode. In this case, a material constituting the first electrode is preferably a material having a large work function from the viewpoint of facilitating the injection of a hole. Specific examples of such material include: transparent conductive materials such as indium tin oxide (ITO), indium zinc oxide (IZO), indium tin oxide doped with silicon oxide (ITSO), indium oxide containing tungsten oxide (IWO), indium zinc oxide containing tungsten oxide (IWZO), indium oxide containing titanium oxide (ITiO), indium tin oxide containing titanium oxide (ITTiO), and indium tin oxide containing molybdenum (ITMO); and metals such as gold, silver, and platinum, and alloys thereof.

The organic EL layer 230 is a laminate including various organic thin films. In the illustrated example, the organic EL layer 230 includes: a hole-injecting layer 230a formed of a hole injectable organic material (such as a triphenylamine derivative), and formed so as to improve the hole injection efficiency from an anode; a hole-transporting layer 230b formed of, for example, copper phthalocyanine; a light-emitting layer 230c formed of a luminous organic substance (such as anthracene, bis[N-(1-naphthyl)-N-phenyl]benzidine, or N,N'-diphenyl-N—N-bis(1-naphthyl)-1,1'-biphenyl)-4,4'-diamine (NPB); an elect non-transporting layer 230d formed of, for example, an 8-quinolinol aluminum complex; and an electron-injecting layer 230e formed of an electron injectable material (such as a perylene derivative or lithium fluoride), and formed so as to improve the electron injection efficiency from a cathode. The organic EL layer 230 is not limited to the illustrated example, and any appropriate combination that can cause light emission through the recombination of an electron and a hole in the light-emitting layer 230c may be adopted. The thickness of the organic EL layer 230 is preferably as small as possible. This is because the layer preferably transmits the emitted light to the extent possible. The organic EL layer 230 can be constituted of an extremely thin laminate having a thickness of, for example, from 5 nm to 200 nm, preferably about 10 nm.

The second electrode 240 can typically function as a cathode. In this case, a material constituting the second electrode is preferably a material having a small work function from the viewpoint of facilitating the injection of an electron to improve luminous efficiency. Specific examples of such material include aluminum, magnesium, and alloys thereof.

The sealing layer 250 is constituted of any appropriate material. The sealing layer 250 is preferably constituted of a material excellent in barrier property and transparency. Typical examples of the material constituting the sealing layer include an epoxy resin and polyurea. In one embodiment, the sealing layer 250 may be formed by applying the epoxy resin (typically an epoxy resin adhesive) and bonding a barrier sheet onto the resin.

It is preferred that the organic EL device 200 may be continuously manufactured by the roll-to-roll process. The organic EL device 200 may be manufactured by, for example, a procedure in accordance with the procedure disclosed in JP 2012-169236 A, the disclosure of which is incorporated herein by reference. Further, the organic EL device 200 may be continuously laminated with the circularly polarizing plate 100 that, has an elongate shape by the roll-to-roll process, to thereby continuously manufacture the organic EL display apparatus 300.

It should be noted that the bendable organic EL display apparatus is disclosed in, for example, JP 4601463 B2 and JP 4707996 B2 in detail. The disclosures of the patent literatures are incorporated herein by reference.

EXAMPLES

Now, the present invention is specifically described by way of Examples. However, the present invention is not limited by Examples below.

Example 1

1-1. Retardation Film 1

Polymerization was performed using a batch polymerization apparatus formed of two vertical reactors each including a stirring blade and a reflux condenser controlled to 100° C. 9,9-[4-(2-Hydroxyethoxy)phenyl]fluorene (BBEPF), isosorbide (ISB), diethylene glycol (DEG), diphenyl carbonate (DPC), and magnesium acetate tetrahydrate were loaded at a molar ratio of BHEPF/ISB/DEG/DPC/magnesium acetate=0.438/0.537/0.025/1.005/1.00×10$^{-5}$. The inside of a first reactor was sufficiently purged with nitrogen (oxygen concentration: 0.0005 vol % to 0.001 vol %), and then heated with a heating medium. When the internal temperature reached 100° C., stirring was started. The internal temperature was caused to reach 220° C., after 40 minutes from the start of the temperature increase. While the temperature was controlled to be kept at this temperature, pressure reduction was simultaneously started, and the pressure was caused to reach 13.3 kPa in 90 minutes after the internal temperature had reached 220° C. A phenol vapor produced as a by-product along with the polymerization reaction was introduced into the reflux condenser at 100° C., a monomer component contained in a slight amount in the phenol vapor was returned to the first reactor, and a phenol vapor, that did not condense was introduced into a condenser at 45° C. and recovered.

Nitrogen was introduced into the first reactor to temporarily return the pressure to the atmospheric pressure. After that, the oligomerized reaction liquid in the first reactor was transferred to a second reactor. Then, temperature increase and pressure reduction in the second reactor were started, and the internal temperature and the pressure were caused to reach 240° C. and 0.2 kPa, respectively in 50 minutes. After that, the polymerization was allowed to proceed until predetermined stirring power was achieved. When the predetermined power was achieved, nitrogen was introduced into the reactor to return the pressure to the atmospheric pressure, and the reaction liquid was extracted in the form of a strand and pelletized with a rotary cutter. Thus, a polycarbonate resin having a copolymerization composition of BHEPF/ISB/DEG=43.8/53.7/2.5 [mol %] was obtained. The polycarbonate resin had a reduced viscosity of 0.430 dL/g and a glass transition temperature of 145° C.

The resultant polycarbonate resin was vacuum-dried at 80° C. for 5 hours, and then a polycarbonate resin film having a thickness of 125 μm was produced using a film-forming apparatus including a single-screw extruder (manufactured by Isuzu Kakoki, screw diameter: 25 mm cylinder preset temperature: 240° C.), a T-die (width: 900 mm, preset temperature: 240° C.), a chill roll (preset temperature: 120° C. to 130° C.), and a take-up unit.

A sample having a width of 250 mm and a length of 250 mm was out of the polycarbonate resin film obtained as described above. Then, the sample was subjected to fixed-end uniaxial lateral stretching with a batch-type biaxial stretching apparatus (manufactured by Bruckner, product name: "KARO-IV") at a stretching temperature of 145.6° C. and a stretching ratio of 2.4 times to produce a retardation film 1 having a thickness of 58 μm.

1-2. Polarizer (Production of Polarizer A1)

One surface of an amorphous isophthalic acid-copolymerized polyethylene terephthalate (IPA-Gopolymerized PET) film (thickness: 100 μm) substrate having a water absorption ratio of 0.75% and a Tg of 75° C. was subjected to corona treatment, and an aqueous solution containing polyvinyl, alcohol (polymerization degree: 4,200, saponification degree: 99.2 mol %) and acetoacetyl-modified PVA (polymerization degree: 1,200, acetoacetyl modification degree: 4.6%, saponification degree: 99.0 mol % or more, manufactured by The Nippon Synthetic Chemical Industry Co., Ltd., product name: "GOHSEFIMER Z-200") at a ratio of 9:1 was applied onto the corona-treated surface and dried at 25° C. to form a PVA-based resin layer having a thickness of 11 μm. Thus, a laminate was produced.

The resultant laminate was subjected to free-end uniaxial stretching in an oven at 120° C. between rolls having different peripheral speeds in a longitudinal direction (lengthwise direction) at 2.0 times (in-air auxiliary stretching treatment).

Then, the laminate was immersed in an insolubilizing bath having a liquid temperature of 30° C. (an aqueous solution of boric acid obtained by compounding 100 parts by weight of water with 4 parts by weight of boric acid) for 30 seconds (insolubilizing treatment).

Then, the laminate was immersed in a dyeing bath having a liquid temperature of 30° C. while an iodine concentration and an immersion time were adjusted so that a polarizing plate had a predetermined transmittance. In this Example, the laminate was immersed in an aqueous solution of iodine, which was obtained by compounding 100 parts by weight of water with 0.2 part by weight of iodine and with 1.0 part by weight of potassium iodide, for 60 seconds (dyeing treatment).

Then, the laminate was immersed in a cross-linking bath having a liquid temperature of 30° C. (an aqueous solution of boric acid obtained by compounding 100 parts by weight of water with 3 parts by weight of potassium iodide and with 3 parts by weight of boric acid) for 30 seconds (cross-linking treatment).

After that, the laminate was subjected to uniaxial stretching between rolls having different peripheral speeds in a longitudinal direction (lengthwise direction) so that a total stretching ratio became 5.5 times while being immersed in an aqueous solution of boric acid having a liquid temperature of 70° C. (an aqueous solution obtained by compounding 100 parts by weight of water with 4 parts by weight of boric acid and with 5 parts by weight of potassium iodide) (underwater stretching treatment).

After that, the laminate was immersed in a washing bath having a liquid temperature of 30° C. (an aqueous solution obtained by compounding 100 parts by weight of water with 4 parts by weight of potassium iodide) (washing treatment).

Thus, an optical film laminate including a polarizer A1 having a thickness of 5 μm was obtained.

1-3. Circularly Polarizing Plate
(Production of Protective Film B1)

A protective film (meth) acrylic resin film having a lactone ring structure: thickness: 40 μm) was used, after being subjected to corona treatment on one surface (surface to be bonded to a polarizer).

(Hard Coat Treatment on Protective Film B1)

40 Parts of a pentadecafunctional urethane-acrylic oligomer (manufactured by Shin Nakamura Chemical Co., Ltd., product name: NK Oligo UA-53H, weight-average molecular weight: 2,300), 40 parts of pentaerythritol triacrylate (PETA) (manufactured by Osaka Organic Chemical Industry Ltd., product name: Viscoat #300), 16 parts of 4-hydroxybutyl acrylate (4-HBA) (manufactured by Osaka Organic Chemical Industry Ltd.), 4 parts of ethoxylated glycerin triacrylate (manufactured by Shin Nakamura Chemical Co., Ltd., product name: A-GLY-9E), 5 parts of a leveling agent (manufactured by DIC Corporation, product name: GRANDIC PC-4100), and 3 parts of a photopolymerization initiator (manufactured by BASF SE, product name: IRGACURE 907) were mixed and diluted with methyl isobutyl ketone to a solid content of 50% to prepare a composition for forming a hard coat layer.

The resultant composition for forming a hard coat layer was applied onto the protective film B1 to form an applied layer, and the applied layer was heated at 90° C. for 1 minute. The applied layer after the heating was irradiated with UV light having an integrated light quantity of 300 mJ/cm$^2$ through the use of a high-pressure mercury lamp to form a hard coat layer having a thickness of 5 μm.

(Production of Adhesive to be Applied to Protective Film)

40 Parts by weight of N-hydroxyethylacrylamides (HEAA), 60 parts by weight of acryloylmorpholine (ACMO), and 3 parts by weight of a photoinitiator "IRGACURE 819" (manufactured by BASF SE) was mixed to prepare a UV-curable adhesive.

(Production of Polarizing Plate)

The protective film B1 having the hard coat layer was bonded to one side of the polarizer A1 through the intermediation of the UV-curable adhesive. Then, the retardation film was bonded to the other side of the polarizer through the intermediation of the UV-curable adhesive. In this case, the bonding was performed so that the slow axis of the retardation film was positioned at 45° in a counterclockwise direction with respect to the absorption axis of the polarizer. Thus, a circularly polarizing plate (optical laminate) was produced.

1-4. Pressure-Sensitive Adhesive

A pressure-sensitive adhesive to be used in this Example was produced by the following method.

(Preparation of (Meth)Acrylic Polymer)

A four-necked flask with a stirring blade, a thermometer, a nitrogen gas inlet tube, and a condenser was loaded with a monomer mixture containing 99 parts by weight of butyl acrylate (BA) and 1 part by weight of 4-hydroxybutyl acrylate (HBA). Further, with respect to 100 parts by weight of the monomer mixture (solid content), 0.1 part by weight of 2,2'-azobisisobutyronitrile was loaded as a polymerization initiator together with ethyl acetate, and while the contents were gently stirred, a nitrogen gas was introduced to perform nitrogen purging. After that, a polymerization reaction was performed, for 7 hours with the liquid temperature in the flask being kept around 55° C. After that, ethyl acetate was added to the resultant reaction liquid to prepare a solution of a (meth)acrylic polymer having a weight-average molecular weight of 1,600,000, in which the solid content had been adjusted to 30%.

(Preparation of Acrylic Pressure-Sensitive Adhesive Composition)

With respect to 100 parts by weight of the solid content of the resultant (meth) acrylic polymer solution, 0.2 part by weight of an isocyanate-based cross-linking agent (product name: TAKENATE D110N, trimethylolpropane-xylylene diisocyanate, manufactured by Mitsui Chemicals, Inc.) and 0.08 part by weight of a silane coupling agent (product name: KBM403, manufactured by Shin-Etsu Chemical Co., Ltd.) were blended to prepare an acrylic pressure-sensitive adhesive composition.

1-5. Production of Optical Laminate 1

The acrylic pressure-sensitive adhesive composition was uniformly applied with a fountain coater onto the surface of a polyethylene terephthalate (PET) film (separator) having a thickness of 38 μm, which had been treated with a silicone-based release agent, and was dried in an air circulating thermostat oven at 155° C. for 2 minutes to form a pressure-sensitive adhesive layer having a thickness of 25 μm on the surface of the separator. Then, the separator was bonded to the retardation film side of the circularly polarizing plate obtained above through the intermediation of the pressure-sensitive adhesive layer, the separator was peeled off, and then a PET film (thickness: 38 μm: assuming a bendable organic EL panel) was bonded to the remainder to produce an optical laminate 1.

Example 2

2-1. Transparent Conductive Film 1
(Formation of Cured Resin Layer)

A spherical particle-containing curable resin composition containing 100 parts by weight of a UV-curable resin composition (manufactured by DIC Corporation, product name: "UNIDIC (trademark) RS29-120") and 0.002 part by weight of acrylic spherical particles having a mode particle diameter of 1.9 μm (manufactured by Soken Chemical & Engineering Co., Ltd., product name: "MX-180TA") was prepared. The prepared spherical particle-containing curable resin composition was applied onto one surface of an elongate substrate having a thickness of 23 μm and a width of 1,550 mm (polycycloolefin film, manufactured by Zeon Corporation, product name: "ZEONOR (trademark)") to form an applied layer. Then, the applied layer was irradiated with UV light from the side on which the applied layer had been formed, and thus a second cured resin layer was formed so as to have a thickness of 1.0 μm. A first cured resin layer was formed on the other surface of the substrate so as to have a thickness of 1.0 μm by the same method as above except, for containing no spherical particles. Further, an organic-inorganic hybrid resin (manufactured by JSR Corporation, product name: OPSTAR Z7412 (trademark), solid content: 20%, solvent: 80%) formed of zirconium oxide particles having an average particle diameter of 30 nm and an acrylic resin binder was applied onto the first cured resin layer to form an optical adjustment layer to provide a substrate laminate. The substrate laminate was subjected to heat winding treatment to produce a roll of the substrate laminate wound in a roll shape.

(Formation of Transparent Conductive Layer)

Next, the substrate laminate fed from the roll was loaded into a take-up sputtering device, and an amorphous indium tin oxide (ITO) layer having a thickness of 27 nm was formed on the surface of the first cured resin layer. After that, the substrate laminate having formed thereon the amorphous ITO layer (transparent conductive layer) was loaded into an air circulating oven in a roll-to-roll manner, and was subjected to heating treatment at 130° C. for 90 minutes to convert the transparent conductive layer from being amorphous to being crystalline, to form a transparent conductive film having a transparent conductive layer with a surface resistance value of 100Ω/□. Thus, a transparent conductive film 1 wound in a roll shape was produced.

2-2. Production of Optical Laminate 2

The transparent conductive film 1 obtained above was bonded to the retardation film side of the circularly polarizing plate, obtained in Example 1 through the intermediation of the pressure-sensitive adhesive, and then a separator was bonded to the ITO side thereof through the intermediation of the pressure-sensitive adhesive layer to produce an optical laminate 2.

Example 3

3-1. Transparent Conductive Film 2

A transparent conductive film 2 was produced in the same manner as the transparent conductive film 1 except that the substrate was changed from the polycycloolefin film to a polyethylene terephthalate (PET) film (thickness: 23 μm).

3-2. Production of Optical Laminate 3

The protective film B1 (without the hard coat layer) was bonded to one side of the polarizer A1 through the intermediation of the UV-curable adhesive. Then, the transparent conductive film 2 was bonded to the protective film B1 side of the laminate of the polarizer. A1 and the protective film B1 through the intermediation of the pressure-sensitive adhesive. Further, the protective film B1 subjected to the hard coat treatment was bonded to the ITO side thereof through the intermediation of the pressure-sensitive adhesive. Further, the retardation film was bonded to the other side of the polarizer A1 through the intermediation of the UV-curable adhesive. In this case, the bonding was performed so that the slow axis of the retardation film was positioned at 45° in a counterclockwise direction with respect to the absorption axis of the polarizer. Thus, an optical laminate 3 was produced.

Example 4

An optical laminate 4 was produced in the same manner as in Example 1 except that a first liquid crystal alignment fixed layer (λ/2 plate) and a second liquid crystal, alignment fixed layer (λ/4 plate) were used in the stated order from the polarizer side in place of the retardation film 1. The liquid crystal alignment fixed layers were produced as described below.

A polymerizable liquid crystal material showing a nematic liquid crystal phase (manufactured by BASF SE: product name: Paliocolor LC242) was used as a liquid crystal material. A photopolymerization initiator for the polymerizabie liquid crystal material (manufactured by BASF SE: product name: IRGACURE 907) was dissolved in toluene. Further, a MEGAFACE series manufactured by DIC Corporation, was added, for the purpose of improving applicability at from about 0.1% to about 0.5% depending on the thickness of a liquid crystal layer to be obtained, to prepare a liquid crystal application liquid. The liquid crystal application liquid was applied with a bar coater onto an alignment substrate and then dried by heating at 90° C. for 2 minutes, and then its alignment was fixed by curing with UV light under a nitrogen atmosphere. The second liquid crystal alignment fixed layer (λ/4 plate) and the first liquid crystal alignment fixed layer (λ/2 plate) were formed on separate alignment substrates. The first liquid crystal alignment fixed layer (λ/2 plate) had a thickness of 2 μm, and the second liquid crystal alignment fixed layer (λ/4 plate) had a thickness of 1 μm. The alignment substrates used were each a substrate capable of allowing the liquid crystal alignment fixed layer to be transferred later, such as PET, and the first liquid crystal alignment fixed layer (λ/2 plate) and the second liquid crystal alignment fixed layer (λ/4 plate) were sequentially transferred so that the first-liquid crystal alignment fixed layer (λ/2 plate) was adjacent to the polarizer A1.

Example 5 to 17

Optical laminates each having the same layer configuration as that of the optical laminate 1 were produced in the same manner as in Example 1 except that, configurations shown in Table 1 were adopted. Protective trims B2 to B6 in Table 1 are as described below.

Protective film B2 polyamide film (manufactured by Unitika Ltd., "Uniamide EX-25", thickness: 25 μm)

Protective film B3: transparent polyimide film (manufactured by I.S.T Corporation, "TOPMED", thickness: 25 μm)

Protective film B4: transparent polyimide film (manufactured by Mitsubishi Gas Chemical Company, "Neopulim L-AJFF-50", thickness: 50 μm)

Protective film B5: polycarbonate film (manufactured by Mitsubishi Engineering-Plastics Corporation, "Iupilon KH3520 UR", thickness: 40 μm)

Protective film B6: polyethylene terephthalate film (manufactured by Toyobo Co., Ltd. "COSMOSHINE A4100", thickness: 50 μm)

Example 18

An optical laminate having the same layer configuration as that of the optical laminate 1 was produced in the same manner as in Example 1 except that the material for forming the hard coat layer was changed. The material for forming the hard coat layer is as described below.

6 Parts of UV-curable polyrotaxane (manufactured by Advanced Softmaterials Inc., product name: SeRM Super Polymer SA2403P) and 20 parts of nanosilica particles (manufactured by Nissan Chemical Industries, Ltd., product name: ORGANOSILICASOL MIBK-ST (average particle diameter: 10 nm to 15 nm)) were added to and mixed with 100 parts of the composition for forming a hard coat layer described in Example 1 to provide a composition for forming the hard coat layer.

Comparative Example 1

The protective film B1 subjected to the hard coat treatment described in Example 1 was used as it was to serve as an optical laminate 5.

Comparative Example 2

An optical laminate 6 was produced in the same manner as in Example 1 except that a protective film B7 (triacetyl cellulose (TAC): thickness: 40 μm) was used in place of the protective film B1.

Comparative Example 3

C3-1. Production of Polarizer A2 (Polarizer having Thickness of 12 μm)

A polyvinyl alcohol film having an average polymerization degree of 2,400, a saponification degree of 99.9 mol %, and a thickness of 30 μm was swollen by being immersed in warm water at 30° C. for 60 seconds. Then, the film was immersed in an aqueous solution having a concentration of iodine/potassium iodide (weight ratio=0.5/8) of 0.3% to be dyed while being stretched at a ratio of 3.5 times. After that, the film was stretched in an aqueous solution of a boric acid ester at 65° C. so that a total stretching ratio became 6 times. After the stretching, the film was dried in an oven at 40° C. for 3 minutes to provide a PVA-based polarizer. The resultant polarizer had a thickness of 12 μm.

C3-2. Protective Film B7

Triacetylcellulose (TAC, thickness: 40 μm) was used as the protective film B7.

C3-3. Production of Optical Laminate 6

An optical laminate having the same layer configuration as that of the optical laminate 6 was produced in the same manner as in Example 1 except that: the polarizer A2 was used in place of the polarizer A1; and the protective film B7 was used in place of the protective film B1.

Comparative Example 4

An optical laminate having the same layer configuration as that of the optical laminate 6 was produced in the same manner as in Comparative Example 3 except that the protective film B7 was not subjected to the hard coat treatment.

Comparative Example 5

An optical laminate having the same layer configuration as that of the optical laminate 6 was produced, in the same manner as in Comparative Example 3 except that, the polarizer A3 (thickness: 18 μm) was used in place of the polarizer A2.

Comparative Example 6

An optical laminate having the same layer configuration, as that of the optical laminate 6 was produced in the same manner as in Comparative Example 3 except that the polarizer M (thickness: 23 μm) was used in place of the polarizer A2.

<Evaluation>

1. Pencil Hardness

The hard coat-treated surface (when the hard coat treatment was not performed, the protective film surface) of the protective film of the optical laminate obtained in each of Examples and Comparative Examples was measured for its pencil hardness in conformity to the pencil hardness test of JIS K 5600-5-4 (provided that the load was 500 g).

2. Scratch Resistance (Steel Wool (SW) Evaluation)

The hard coat-treated surface (when the hard coat treatment was not performed, the protective film surface) of the protective film of the optical laminate obtained in each of Examples and Comparative Examples was rubbed 300 times back and forth with steel wool (manufactured, by Nippon Steel Wool Co., Ltd. Bonstar #0000) having applied thereto a load of 500 g/cm² using a Gakushin-type rubbing fastness tester (manufactured by Tester Sangyo Co., Ltd., AB-301) and a change in external appearance due to a scratch, a flaw, or the like was visually evaluated. Evaluation criteria are as described below.

○: No flaw was found.

x: A flaw was found.

3. Bending Resistance Evaluation

Figure 5:
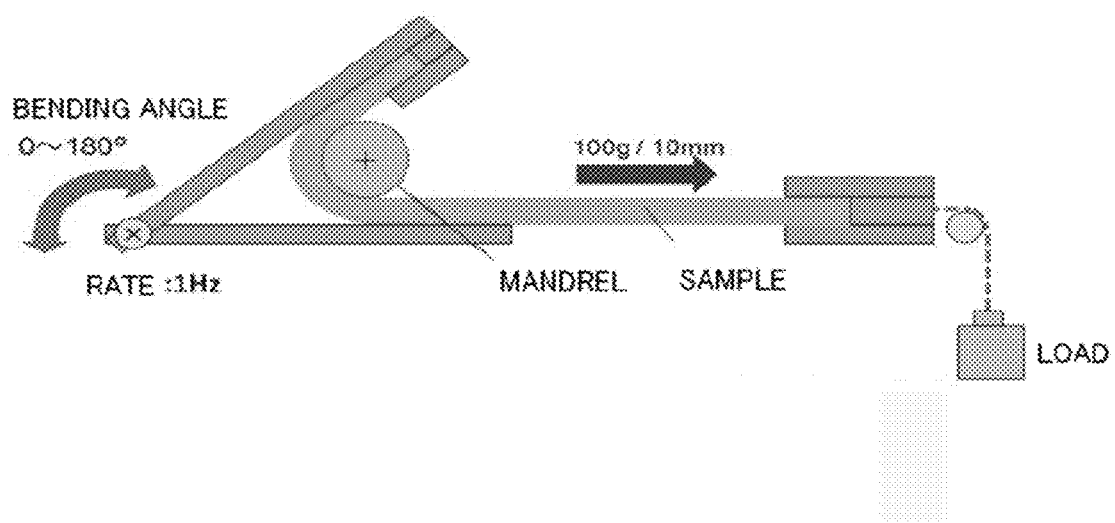
FIG. 5 is a schematic view of a tester used for bending resistance evaluation in Examples and Comparative Examples.

FIG. 5 is a schematic view of a 180° folding endurance tester (manufactured by Imoto Machinery Co., Ltd.). This apparatus has a mechanism in which a chuck on one side repeats 180° bending across a mandrel, and is capable of changing a bending radius (radius of curvature) on the basis of the diameter of the mandrel. A test was performed by placing the optical laminate (30 mm×150 mm) obtained in each of Examples and Comparative Examples in the apparatus so that the hard coat side or protective film surface thereof was bent, inwardly, and repeating bending under the conditions of a temperature of 25° C., a bending angle of 170°, a bending radius of from 1 mm to 3 mm, a bending rate of 1 second/time, and a weight of 100 g. Bending resistance was evaluated on the basis of the number of times of bending at which breakage of the optical laminate occurred. The breakage was visually evaluated. Evaluation criteria are as described below.

A: Breakage does not occur even at a number of times of 1,000,000 or more.

B: Breakage occurs at a number of times of from 200,000 to 500,000.

C: Breakage occurs at a number of times of from 10,000 to less than 100,000.

D: Breakage occurs at a number of times of less than 10,000.

TABLE 1

|  | Optical Laminate configuration | Total thickness (μm) | Hard coat thickness (μm) | Protective film | Protective film composition | Protective film thickness (μm) | Polarizer | Polarizer thickness (μm) | Pencil hardness | Scratch resistance | Bending radius (mm) | Bending resistance |
|---|---|---|---|---|---|---|---|---|---|---|---|---|
| Example 1 | 1 | 173 | 5 | B1 | Acrylic | 40 | A1 | 5 | 2H | ○ | 3 | A |
| Example 2 | 2 | 221 | 5 | B1 | Acrylic | 40 | A1 | 5 | 2H | ○ | 3 | A |
| Example 3 | 3 | 286 | 5 | B1 | Acrylic | 40 | A1 | 5 | 2H | ○ | 3 | A |
| Example 4 | 4 | 122 | 5 | B1 | Acrylic | 40 | A1 | 5 | 2H | ○ | 3 | A |
| Example 5 | 1 | 178 | 10 | B1 | Acrylic | 40 | A1 | 5 | 4H | ○ | 3 | A |
| Example 6 | 1 | 183 | 15 | B1 | Acrylic | 40 | A1 | 5 | 5H | ○ | 3 | A |
| Example 7 | 1 | 188 | 20 | B1 | Acrylic | 40 | A1 | 5 | 6H | ○ | 3 | A |
| Example 8 | 1 | 173 | 5 | B1 | Acrylic | 40 | A1 | 5 | 2H | ○ | 2 | A |
| Example 9 | 1 | 173 | 5 | B1 | Acrylic | 40 | A1 | 5 | 2H | ○ | 1 | B |
| Example 10 | 1 | 178 | 10 | B1 | Acrylic | 40 | A1 | 5 | 4H | ○ | 1 | B |

TABLE 1-continued

|  | Optical Laminate configuration | Total thickness (μm) | Hard coat thickness (μm) | Protective film | Protective film composition | Protective film thickness (μm) | Polarizer | Polarizer thickness (μm) | Pencil hardness | Scratch resistance | Bending radius (mm) | Bending resistance |
|---|---|---|---|---|---|---|---|---|---|---|---|---|
| Example 11 | 1 | 183 | 15 | B1 | Acrylic | 40 | A1 | 5 | 5H | ○ | 1 | B |
| Example 12 | 1 | 153 | 5 | B2 | Polyamide | 25 | A1 | 5 | 3H | ○ | 3 | A |
| Example 13 | 1 | 153 | 0 | B3 | Polyimide | 25 | A1 | 5 | 2H | x | 3 | A |
| Example 14 | 1 | 158 | 5 | B3 | Polyimide | 25 | A1 | 5 | 5H | ○ | 3 | A |
| Example 15 | 1 | 183 | 5 | B4 | Polyimide | 50 | A1 | 5 | 5H | ○ | 3 | A |
| Example 16 | 1 | 173 | 5 | B5 | Polycarbonate | 40 | A1 | 5 | 3H | ○ | 3 | A |
| Example 17 | 1 | 183 | 5 | B6 | PET | 50 | A1 | 5 | 2H | ○ | 3 | A |
| Example 18 | 1 | 173 | 5 | B1 | Acrylic | 40 | A1 | 5 | 2H | ○ | 1 | A |
| Comparative Example 1 | 5 | 45 | 5 | B1 | Acrylic | 40 | — | — | 2H | ○ | 3 | C |
| Comparative Example 2 | 6 | 178 | 10 | B1 | TAC | 40 | A1 | 5 | 3H | ○ | 3 | D |
| Comparative Example 3 | 6 | 185 | 10 | B7 | TAC | 40 | A2 | 12 | 3H | ○ | 3 | D |
| Comparative Example 4 | 6 | 175 | 0 | B7 | TAC | 40 | A2 | 12 | 6H | x | 2 | D |
| Comparative Example 5 | 6 | 191 | 10 | B7 | TAC | 40 | A3 | 18 | 3H | ○ | 3 | D |
| Comparative Example 6 | 6 | 196 | 10 | B7 | TAC | 40 | A4 | 23 | 3H | ○ | 3 | D |

As is apparent from Table 1, it is found that the optical laminates of Examples of the present invention are each excellent in balance among pencil hardness, scratch resistance, and bending resistance.

INDUSTRIAL APPLICABILITY

The optical laminate of the present invention is suitably used for an organic EL display apparatus, and can be particularly suitably used for a bendable or foldable organic EL display apparatus.

REFERENCE SIGNS LIST 10 surface protective layer
20 polarizer
30 optical compensation layer
31 first liquid crystal alignment fixed, layer
32 second liquid crystal alignment fixed layer
100 optical laminate
101 optical laminate
200 organic EL device
300 organic EL display apparatus

The invention claimed is:

1. An optical laminate to be used for an organic electroluminescence display apparatus, comprising, in this order:
   a surface protective layer;
   a polarizer; and
   an optical compensation layer,
   wherein the surface protective layer is flexible, has a function of substituting for a cover glass for an organic electroluminescence display apparatus, and functions as a protective layer for the polarizer,
   wherein the optical compensation layer includes a first liquid crystal alignment fixed layer and a second liquid crystal alignment fixed layer in the stated order from a polarizer side,
   wherein the first liquid crystal alignment fixed layer has an in-plane retardation Re(550) of from 180 nm to 320 nm, and the second liquid crystal alignment fixed layer has an in-plane retardation Re(550) of from 100 nm to 180 nm, and
   wherein an angle formed between a slow axis of the first liquid crystal alignment fixed layer and an absorption axis of the polarizer is from 10° to 20°, and an angle formed between a slow axis of the second liquid crystal alignment fixed layer and the absorption axis of the polarizer is from 65° to 85°.

2. The optical laminate according to claim 1, wherein the surface protective layer is formed of a single resin film.

3. The optical laminate according to claim 1, wherein the surface protective layer includes a hard coat layer and a resin film in the stated order from a surface side.

4. The optical laminate according to claim 1,
   wherein the surface protective layer has such bendability as to allow the optical laminate to be bent 200,000 times with a radius of curvature of 3 mm or less, and
   wherein a viewer side surface of the surface protective layer has a pencil hardness of 2H or more and such scratch resistance that the viewer side surface is free of occurrence of a flaw when rubbed 300 times back and forth with a load of 1,000 g.

5. The optical laminate according to claim 1,
   wherein the optical compensation layer is formed of a retardation film,
   wherein an in-plane retardation Re(550) of the retardation film is from 100 nm to 180 nm and satisfies a relationship of Re(450)<Re(550)<Re(650), and
   wherein an angle formed between a slow axis of the retardation film and an absorption axis of the polarizer is from 35° to 55°.

6. The optical laminate according to claim 1, further comprising a conductive layer on an opposite side of the optical compensation layer to the polarizer.

7. An organic electroluminescence display apparatus, comprising the optical laminate of claim 1 on a viewer side, wherein the surface protective layer of the laminate is arranged on the viewer side.

8. The organic electroluminescence display apparatus according to claim 7, wherein at least part of the organic electroluminescence display apparatus is bendable with a radius of curvature of 10 mm or less.

* * * * *